(12) United States Patent
Kitai et al.

(10) Patent No.: US 12,233,621 B2
(45) Date of Patent: *Feb. 25, 2025

(54) COPPER-CLAD LAMINATED PLATE, RESIN-CLAD COPPER FOIL, AND CIRCUIT SUBSTRATE USING SAID PLATE AND FOIL

(71) Applicant: PANASONIC INTELLECTUAL PROPERTY MANAGEMENT CO., LTD., Osaka (JP)

(72) Inventors: Yuki Kitai, Osaka (JP); Masashi Koda, Fukushima (JP); Yasunori Hoshino, Osaka (JP); Atsushi Wada, Osaka (JP); Mikio Sato, Fukushima (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 424 days.

This patent is subject to a terminal disclaimer.

(21) Appl. No.: 17/609,695

(22) PCT Filed: May 14, 2020

(86) PCT No.: PCT/JP2020/019351
§ 371 (c)(1),
(2) Date: Nov. 8, 2021

(87) PCT Pub. No.: WO2020/230870
PCT Pub. Date: Nov. 19, 2020

(65) Prior Publication Data
US 2022/0220272 A1      Jul. 14, 2022

(30) Foreign Application Priority Data
May 15, 2019 (JP) .................... 2019-092354

(51) Int. Cl.
*B32B 15/08* (2006.01)
*C08J 7/06* (2006.01)
(Continued)

(52) U.S. Cl.
CPC .............. *B32B 15/08* (2013.01); *C08J 7/06* (2013.01); *H05K 1/0353* (2013.01); *H05K 1/09* (2013.01);
(Continued)

(58) Field of Classification Search
CPC ....... H05K 1/09; C08L 2666/06; C08L 51/06; C08L 2666/24
See application file for complete search history.

(56) References Cited

U.S. PATENT DOCUMENTS

2017/0164469 A1* 6/2017 Kitai ................. B32B 15/14
2017/0303405 A1* 10/2017 Fukuchi ............. H05K 3/022
2021/0108073 A1   4/2021 Kawabe et al.

FOREIGN PATENT DOCUMENTS

EP      1 167 417       1/2002
JP      2006-210689     8/2006
(Continued)

OTHER PUBLICATIONS

ISR issued in WIPO Patent Application No. PCT/JP2020/019351, Jul. 28, 2020, English translation.

*Primary Examiner* — Jasper Saberi
(74) *Attorney, Agent, or Firm* — GREENBLUM & BERNSTEIN, P.L.C.

(57) ABSTRACT

A copper clad laminate includes: an insulating layer containing a cured product of a resin composition; and a surface treated copper foil on one surface or both surfaces of the insulating layer, the resin composition containing a polymer, and the surface treated copper foil including a finely roughened particle treatment layer of copper on at least one
(Continued)

surface side of a copper foil, the finely roughened particle treatment layer being formed of fine copper particles having a particle size of 40 to 200 nm, a heat resistance treatment layer containing nickel provided on the finely roughened particle treatment layer, a rust prevention treatment layer containing at least chromium provided on the heat resistance treatment layer, a silane coupling agent layer provided on the rust prevention treatment layer, and an amount of nickel attached in the heat resistance treatment layer being 30 to 60 mg/m$^2$.

12 Claims, 4 Drawing Sheets

(51) Int. Cl.
*H05K 1/03* (2006.01)
*H05K 1/09* (2006.01)
*H05K 3/02* (2006.01)

(52) U.S. Cl.
CPC .......... *H05K 3/022* (2013.01); *B32B 2457/08* (2013.01); *C08J 2325/06* (2013.01); *H05K 2201/0355* (2013.01); *H05K 2201/0358* (2013.01); *H05K 2203/0392* (2013.01); *H05K 2203/125* (2013.01); *H05K 2203/1377* (2013.01)

(56) References Cited

FOREIGN PATENT DOCUMENTS

| | | |
|---|---|---|
| JP | 2013-023517 | 2/2013 |
| JP | 6110581 B2 | 4/2017 |
| JP | 6182584 B2 | 8/2017 |
| JP | 2018-039995 | 3/2018 |
| JP | 2018-062568 | 4/2018 |
| JP | 2019-194307 | 11/2019 |
| WO | 2000/044805 | 8/2000 |
| WO | 2018/181842 | 10/2018 |

* cited by examiner

COPPER-CLAD LAMINATED PLATE, RESIN-CLAD COPPER FOIL, AND CIRCUIT SUBSTRATE USING SAID PLATE AND FOIL

TECHNICAL FIELD

The present invention relates to a copper clad laminate, a copper foil with resin, and a circuit board fabricated using the copper clad laminate and the copper foil with resin.

BACKGROUND ART

Various metal foils, particularly copper foils, are used as conductors in high speed signal transmission substrates that support high frequencies, but in the future, it will be required to support 5G and WiGig (Wireless Gigabit) that use signals with still higher frequencies than at present. Hence, it is demanded to further decrease the transmission loss of substrates.

It is required to improve the resin base material and copper foil constituting the substrate in order to decrease the transmission loss in such a problem. In other words, it is required to decrease the transmission loss caused by the dielectric material of the resin base material and further to decrease the conductor loss of the copper foil.

Among these, regarding the improvement of copper foil, it has been hitherto attempted to decrease the conductor loss by diminishing the surface roughness and the like. However, when the surface roughness is diminished, the adhesive property and heat resistance to the resin, that are essential as the basic properties of the copper foil used in the substrates, decrease, and there is a problem that the transmission loss increases when the surface roughness is increased. Thus, it has been considered to be difficult to achieve both the transmission properties and the basic properties. It has been considered that this is because when the roughness is diminished, the adhesive area with the resin decreases, it is difficult to obtain adhesion due to the anchor effect, and as a result, the peel strength decreases and the heat resistance also deteriorates, and when the roughness is increased, the resistance of the current flowing on the copper foil surface increases and the transmission loss increases.

In addition, as a surface treated copper foil for high frequency signal transmission circuit formation, it has been reported that the roughening treatment layer which affects the transmission properties is formed of a non-conductive copper composite compound instead of conventional metal copper so that electricity does not flow and thus conduction loss due to the roughening treatment decreases (Patent Literature 1).

In surface treated copper foil for printed wiring boards, it is also known to adjust the average height of roughened particles in the silane coupling agent layer which affects the transmission properties, or the nickel element amount in the metal treatment layer containing nickel (Patent Literature 2).

Meanwhile, it has been reported that the low dielectric properties can be improved by using a resin containing a modified polyphenylene ether compound as the resin base material (Patent Literature 3).

However, in the technique described in Patent Literature 1, barrier treatment, chromate treatment and the like are not performed, and thus there is a problem that the heat resistance is particularly inferior.

On the other hand, in the technique described in Patent Literature 2, the treated amount of the metal treatment layer which functions as a barrier treatment layer is small and there is thus a problem that it is difficult to secure heat resistance in a high temperature region (for example, 150° C. or higher).

At present, a resin containing a compound having a lower dielectric loss tangent is sought in order to impart superior transmission properties to a resin base material.

CITATION LIST

Patent Literature

Patent Literature 1: JP 6,110,581 B2
Patent Literature 2: JP 6,182,584 B2
Patent Literature 3: JP 2013-23517 A

SUMMARY OF INVENTION

The present invention was made in view of such circumstances, and an object thereof is to provide a copper clad laminate and a copper foil with resin which can decrease the transmission loss of a high speed signal transmission substrate and exhibit excellent adhesive property and heat resistance, and a highly reliable circuit board using the copper clad laminate and the copper foil with resin.

A copper clad laminate according to an aspect of the present invention is a copper clad laminate including: an insulating layer containing a cured product of a resin composition; and a surface treated copper foil on one surface or both surfaces of the insulating layer, in which the resin composition contains a polymer having a structural unit represented by the following Formula (1) in a molecule:

[Chemical formula. 1]

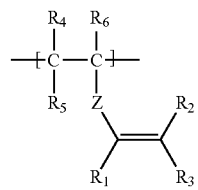

(in Formula (1), Z represents an arylene group, $R_1$ to $R_3$ each independently represent a hydrogen atom or an alkyl group, and $R_4$ to $R_6$ each independently represent a hydrogen atom or an alkyl group having 1 to 6 carbon atoms), and the surface treated copper foil includes a finely roughened particle treatment layer of copper on at least one surface side of a copper foil, in which the finely roughened particle treatment layer is formed of fine copper particles having a particle size of 40 to 200 nm, a heat resistance treatment layer containing nickel is provided on the finely roughened particle treatment layer, a rust prevention treatment layer containing at least chromium is provided on the heat resistance treatment layer, a silane coupling agent layer is provided on the rust prevention treatment layer, and an amount of nickel attached in the heat resistance treatment layer is 30 to 60 mg/m².

A copper foil with resin according to another aspect of the present invention is a copper foil with resin including: a resin layer containing a resin composition or a semi-cured product of the resin composition; and a surface treated copper foil on one surface of the resin layer, in which the resin composition contains a polymer having a structural unit represented by Formula (1) in a molecule, and the surface treated copper foil includes a finely roughened particle treatment layer of copper on at least one surface side of a copper foil, in which the finely roughened particle treatment layer is formed of fine copper particles having a particle size of 40 to 200 nm, a heat resistance treatment layer containing nickel is provided on the finely roughened particle treatment layer, a rust prevention treatment layer containing at least chromium is provided on the heat resistance treatment layer, a silane coupling agent layer is provided on the rust prevention treatment layer, and an amount of nickel attached in the heat resistance treatment layer is 30 to 60 mg/m$^2$.

DESCRIPTION OF EMBODIMENTS

Figure 1:
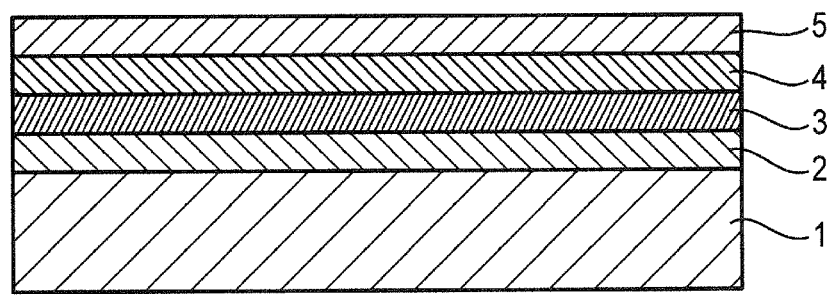
FIG. 1 is a schematic sectional view illustrating a configuration of a surface treated copper foil according to an embodiment of the present invention.

A copper clad laminate according to an aspect of the present invention is a copper clad laminate including: an insulating layer containing a cured product of a resin composition; and a surface treated copper foil on one surface or both surfaces of the insulating layer. The copper foil with resin according to another aspect of the present invention is a copper foil with resin including: a resin layer containing a resin composition or a semi-cured product of the resin composition; and a surface treated copper foil on one surface of the resin layer.

According to the present invention, it is possible to provide a copper clad laminate and a copper foil with resin which can decrease the transmission loss of a high speed signal transmission substrate and exhibit excellent adhesive property and heat resistance, and a highly reliable circuit board using the copper clad laminate and the copper foil with resin.

Hereinafter, the respective configurations of the copper clad laminate and copper foil with resin according to the present embodiment will be specifically described. In the following description, each reference numeral indicates: 1 copper foil, 2 finely roughened particle treatment layer, 3 heat resistance treatment layer, 4 rust prevention treatment layer, 5 silane coupling agent layer, 11 copper clad laminate, 12 and 32 insulating layer, 13 surface treated copper foil, 14 wiring, 21 wiring board, and 31 copper foil with resin.

<Copper Clad Laminate>

Figure 2:
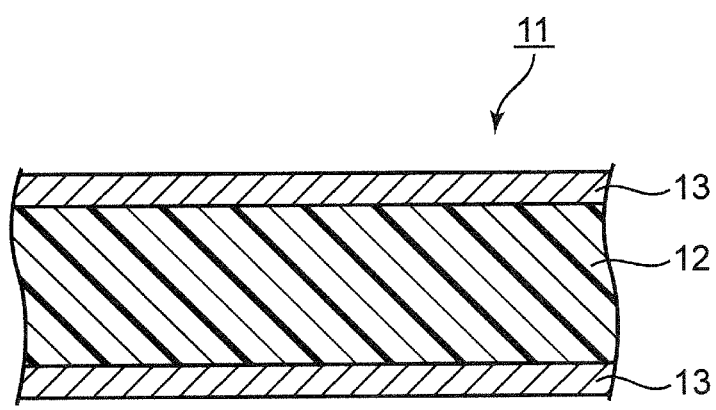
FIG. 2 is a schematic sectional view illustrating a configuration of a metal-clad laminate plate according to an embodiment of the present invention.

As illustrated in FIG. 2, a copper clad laminate 11 of the present embodiment includes an insulating layer 12, to be described below, which contains a cured product of a resin composition and a copper foil 13 (surface treated copper foil), to be described below, on one surface or both surfaces of the insulating layer 12. With such a configuration, it is possible to provide a highly reliable copper clad laminate which exhibits adhesive property and heat resistance and has decreased transmission loss.

<Insulating Layer>

First, in the present embodiment, the cured product of a resin composition refers to a cured product in a state in which the curing reaction has proceeded and the resin has been crosslinked so that the cured product does not melt even when heated. The semi-cured product of a resin composition is in a state in which the resin composition has been cured to an extent that the resin composition can be further cured. In other words, the semi-cured product is in a state in which the resin composition has been semi-cured (B-staged). For example, when the resin composition is heated, the viscosity gradually decreases at the beginning, then curing starts, and the viscosity gradually increases. In such a case, the semi-cured state includes a state in which the viscosity has started to increase but curing is not completed, and the like.

The insulating layer included in the copper clad laminate of the present embodiment contains a cured product of a resin composition to be described below. The insulating layer may further contain a glass base material described later. The thickness of the insulating layer is not particularly limited but is about 20 to 800 μm.

The resin composition constituting the insulating layer of the present embodiment is a resin composition containing a polymer having a structural unit represented by the following Formula (1) in the molecule.

[Chemical formula. 2]

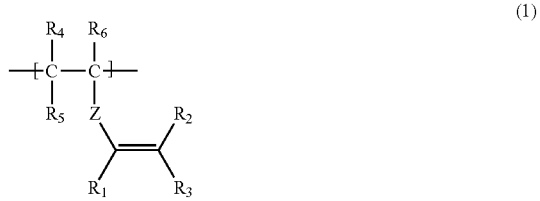

In Formula (1), Z represents an arylene group. $R_1$ to $R_3$ are independent of each other. In other words, $R_1$ to $R_3$ may be the same group as or different groups from each other. $R_1$ to $R_3$ represent a hydrogen atom or an alkyl group. $R_4$ to $R_6$ are independent of each other. In other words, $R_4$ to $R_6$ may be the same group as or different groups from each other. $R_4$ to $R_6$ represent a hydrogen atom or an alkyl group having 1 to 6 carbon atoms.

The present inventors carried out various investigations in order to provide a resin composition which is superior in heat resistance and low dielectric properties to the conventional resin compositions, for example, the resin composition described in Patent Literature 1. Specifically, the present inventors focused on the polymer, namely, a polymer having a structural unit represented by the following Formula (1) in the molecule and found out that a cured product obtained by curing this polymer exhibits excellent heat resistance and low dielectric properties.

From the above fact, the resin composition is a resin composition which provides a cured product exhibiting low dielectric properties and high heat resistance.

(Polymer)

The polymer is not particularly limited as long as it is a polymer having the structural unit represented by Formula (1) in the molecule. The polymer may have a structural unit other than the structural unit represented by Formula (1) as long as it is a polymer having the structural unit represented by Formula (1) in the molecule. The polymer may include a repeating unit in which the structural unit represented by Formula (1) is repeatedly bonded, or the polymer may be a polymer in which a repeating unit in which the structural unit represented by Formula (1) is repeatedly bonded and a repeating unit in which a structural unit other than the structural unit represented by Formula (1) is repeatedly bonded are randomly bonded. In other words, the polymer may be a block copolymer or a random copolymer when the polymer has a structural unit other than the structural unit represented by Formula (1).

The arylene group in Formula (1) is not particularly limited. Examples of this arylene group include a monocyclic aromatic group such as a phenylene group, and a polycyclic aromatic group in which the aromatic is not a single ring but a polycyclic aromatic such as a naphthalene ring. This arylene group also includes a derivative in which a hydrogen atom bonded to an aromatic ring is substituted with a functional group such as an alkenyl group, an alkynyl group, a formyl group, an alkylcarbonyl group, an alkenylcarbonyl group, or an alkynylcarbonyl group.

The alkyl group represented by $R_1$ to $R_3$ in Formula (1) is not particularly limited, and for example, an alkyl group having 1 to 18 carbon atoms is preferable and an alkyl group having 1 to 10 carbon atoms is more preferable. Specific examples thereof include a methyl group, an ethyl group, a propyl group, a hexyl group, and a decyl group.

The alkyl group having 1 to 6 carbon atoms, which is represented by $R_4$ to $R_6$ in Formula (1), is not particularly limited, and specific examples thereof include a methyl group, an ethyl group, a propyl group, and a hexyl group.

It is preferable that the polymer includes an aromatic polymer having a structural unit derived from a bifunctional aromatic compound in which two carbon-carbon unsaturated double bonds are bonded to an aromatic ring as the structural unit represented by Formula (1). The structural unit derived from a bifunctional aromatic compound is a structural unit obtained by polymerizing the bifunctional aromatic compound. In the present specification, the aromatic polymer is also referred to as a divinyl aromatic polymer.

The bifunctional aromatic compound is not particularly limited as long as it is a bifunctional aromatic compound in which two carbon-carbon unsaturated double bonds are bonded to an aromatic ring. Examples of the bifunctional aromatic compound include m-divinylbenzene, p-divinylbenzene, 1,2-diisopropenylbenzene, 1,3-diisopropenylbenzene, 1,4-diisopropenylbenzene, 1,3-divinylnaphthalene, 1,8-divinylnaphthalene, 1,4-divinylnaphthalene, 1,5-divinylnaphthalene, 2,3-divinylnaphthalene, 2,7-divinylnaphthalene, 2,6-divinylnaphthalene, 4,4'-divinylbiphenyl, 4,3'-divinylbiphenyl, 4,2'-divinylbiphenyl, 3,2'-divinylbiphenyl, 3,3'-divinylbiphenyl, 2,2'-divinylbiphenyl, 2,4-divinylbiphenyl, 1,2-divinyl-3,4-dimethylbenzene, 1,3-divinyl-4,5,8-tributylnaphthalene, and 2,2'-divinyl 4-ethyl-4'-propylbiphenyl. These may be used singly or in combination of two or more kinds thereof. Among these, the bifunctional aromatic compound is preferably divinylbenzene such as m-divinylbenzene and p-divinylbenzene, more preferably p-divinylbenzene.

The aromatic polymer may have not only a structural unit derived from the bifunctional aromatic compound but also another structural unit. Examples of the other structural unit include a structural unit derived from a monofunctional aromatic compound in which one carbon-carbon unsaturated double bond is bonded to an aromatic ring, a structural unit derived from a trifunctional aromatic compound in which three carbon-carbon unsaturated double bonds are bonded to an aromatic ring, structural units derived from indenes, and structural units derived from acenaphthylenes. The structural unit derived from a monofunctional aromatic compound is a structural unit obtained by polymerizing the monofunctional aromatic compound. The structural unit derived from a trifunctional aromatic compound is a structural unit obtained by polymerizing the trifunctional aromatic compound. The structural units derived from indenes are structural units obtained by polymerizing indenes. The structural units derived from acenaphthylenes are structural units obtained by polymerizing acenaphthylenes.

In the monofunctional aromatic compound, it is only required that one carbon-carbon unsaturated double bond is bonded to an aromatic ring, and a group other than the carbon-carbon unsaturated double bond may be bonded to the aromatic ring. Examples of the monofunctional aromatic compound include a monofunctional aromatic compound in which one carbon-carbon unsaturated double bond is bonded to an aromatic ring and a group other than this carbon-carbon unsaturated double bond is not bonded the aromatic ring and a monofunctional aromatic compound in which one carbon-carbon unsaturated double bond is bonded to an aromatic ring and an alkyl group such as an ethyl group is further bonded to the aromatic ring.

Examples of the monofunctional aromatic compound in which one carbon-carbon unsaturated double bond is bonded to an aromatic ring and a group other than this carbon-carbon unsaturated double bond is not bonded the aromatic ring include styrene, 2-vinylbiphenyl, 3-vinylbiphenyl, 4-vinylbiphenyl, 1-vinylnaphthalene, 2-vinylnaphthalene, and α-alkyl-substituted styrene. Examples of the α-alkyl-substituted styrene include α-methylstyrene, α-ethylstyrene, α-propylstyrene, α-n-butylstyrene, α-isobutylstyrene, α-t-butylstyrene, α-n-pentylstyrene, α-2-methylbutylstyrene, α-3-methylbutyl-2-styrene, α-t-butylstyrene, α-t-butylstyrene, α-n-pentylstyrene, α-2-methylbutylstyrene, α-3-methylbutylstyrene, α-t-pentylstyrene, α-n-hexylstyrene, α-2-methylpentylstyrene, α-3-methylpentylstyrene, α-1-methylpentylstyrene, α-2,2-dimethylbutylstyrene, α-2,3-dimethylbutylstyrene, α-2,4-dimethylbutylstyrene, α-3,3-dimethylbutylstyrene, α-3,4-dimethylbutylstyrene, α-4,4-dimethylbutylstyrene, α-2-ethylbutylstyrene, α-1-ethylbutylstyrene, α-cyclohexylstyrene, and α-cyclohexylstyrene. These may be used singly or in combination of two or more kinds thereof.

Examples of monofunctional aromatic compounds in which one carbon-carbon unsaturated double bond is bonded to an aromatic ring and an alkyl group is further bonded to the aromatic ring include a nuclear alkyl-substituted aromatic compound and alkoxy-substituted styrene.

Examples of the nuclear alkyl-substituted aromatic compound include an ethyl vinyl aromatic compound in which an alkyl group bonded to an aromatic ring is an ethyl group, nuclear alkyl-substituted styrene in which an alkyl group is bonded to styrene as an aromatic ring, and nuclear alkyl-substituted aromatic compounds (other nuclear alkyl-substituted aromatic compounds) other than the ethyl vinyl aromatic compound and the nuclear alkyl-substituted styrene.

Examples of the ethyl vinyl aromatic compound include o-ethyl vinyl benzene, m-ethylvinylbenzene, p-ethylvinylbenzene, 2-vinyl-2'-ethylbiphenyl, 2-vinyl-3'-ethylbiphenyl, 2-vinyl-4'-ethylbiphenyl, 3-vinyl-2'-ethylbiphenyl, 3-vinyl-3'-ethylbiphenyl, 3-vinyl-4'-ethylbiphenyl, 4-vinyl-2'-ethylbiphenyl, 4-vinyl-3'-ethylbiphenyl, 4-vinyl-4'-ethylbiphenyl, 1-vinyl-2-ethylnaphthalene, 1-vinyl-3-ethylnaphthalene, 1-vinyl-4-ethylnaphthalene, 1-vinyl-5-ethylnaphthalene, 1-vinyl-6-ethylnaphthalene, 1-vinyl-7-ethylnaphthalene, 1-vinyl-8-ethylnaphthalene, 2-vinyl-1-ethylnaphthalene, 2-vinyl-3-ethylnaphthalene, 2-vinyl-4-ethylnaphthalene, 2-vinyl-5-ethylnaphthalene, 2-vinyl-6-ethylnaphthalene, 2-vinyl-7-ethylnaphthalene, and 2-vinyl-8-ethylnaphthalene.

Examples of the nuclear alkyl-substituted styrene include m-methylstyrene, p-methylstyrene, m-propylstyrene, p-propylstyrene, m-n-butylstyrene, p-n-butylstyrene, m-t-butylstyrene, p-t-butylstyrene, m-n-hexylstyrene, p-n-hexylstyrene, m-cyclohexylstyrene, and p-cyclohexylstyrene.

Examples of the other nuclear alkyl-substituted aromatic compounds include 2-vinyl-2'-propylbiphenyl, 2-vinyl-3'-propylbiphenyl, 2-vinyl-4'-propylbiphenyl, 3-vinyl-2'-propylbiphenyl, 3-vinyl-3'-propylbiphenyl, 3-vinyl-4'-propylbiphenyl, 4-vinyl-2'-propylbiphenyl, 4-vinyl-3'-propylbiphenyl, 4-vinyl-4'-propylbiphenyl, 1-vinyl-2-propylnaphthalene, 1-vinyl-3-propylnaphthalene, 1-vinyl-4-propylnaphthalene, 1-vinyl-5-propylnaphthalene, 1-vinyl-6-propylnaphthalene, 1-vinyl-7-propylnaphthalene, 1-vinyl-8-propylnaphthalene, 2-vinyl-1-propylnaphthalene, 2-vinyl-3-propylnaphthalene, 2-vinyl-4-propylnaphthalene, 2-vinyl-5-propylnaphthalene, 2-vinyl-6-propylnaphthalene, 2-vinyl-7-propylnaphthalene, and 2-vinyl-8-propylnaphthalene.

Examples of the alkoxy-substituted styrene include o-ethoxystyrene, m-ethoxystyrene, p-ethoxystyrene, o-propoxystyrene, m-propoxystyrene, p-propoxystyrene, o-n-butoxystyrene, m-n-butoxystyrene, p-n-butoxystyrene, o-isobutoxystyrene, m-isobutoxystyrene, p-isobutoxystyrene, o-t-butoxystyrene, m-t-butoxystyrene, p-t-butoxystyrene, o-n-pentoxystyrene, m-n-pentoxystyrene, p-n-pentoxystyrene, α-methyl-o-butoxystyrene, α-methyl-m-butoxystyrene, α-methyl-p-butoxystyrene, o-t-pentoxystyrene, m-t-pentoxystyrene, p-t-pentoxystyrene, o-n-hexoxystyrene, m-n-hexoxystyrene, p-n-hexoxystyrene, α-methyl-o-pentoxystyrene, α-methyl-m-pentoxystyrene, α-methyl-p-pentoxystyrene, o-cyclohexoxystyrene, m-cyclohexoxystyrene, p-cyclohexoxystyrene, o-phenoxystyrene, m-phenoxystyrene, and p-phenoxystyrene.

As the monofunctional aromatic compound, the compounds exemplified above may be used singly or in combination of two or more kinds thereof. Among the compounds exemplified above, styrene and p-ethylvinylbenzene are preferable as the monofunctional aromatic compound.

Examples of the trifunctional aromatic compound in which three carbon-carbon unsaturated double bonds are bonded to an aromatic ring include 1,2,4-trivinylbenzene, 1,3,5-trivinylbenzene, 1,2,4-triisopropenylbenzene, 1,3,5-triisopropenylbenzene, 1,3,5-trivinylnaphthalene, and 3,5,4'-trivinylbiphenyl. As the trifunctional aromatic compound, the compounds exemplified above may be used singly or in combination of two or more kinds thereof.

Examples of the indenes include indene, alkyl-substituted indene, and alkoxyindene. Examples of the alkyl-substituted indene include methylindene, ethylindene, propylindene, butylindene, t-butylindene, sec-butylindene, n-pentylindene, 2-methyl-butylindene, 3-methyl-butylindene, n-hexylindene, 2-methyl-pentylindene, 3-methyl-pentylindene, and 4-methyl-pentylindene. Examples of the alkyloxyindene include alkyloxyindenes such as methoxyindene, ethoxyindene, putoxyindene, butoxyindene, t-butoxyindene, sec-butoxyindene, n-pentoxyindene, 2-methyl-butoxyindene, 3-methyl-butoxyindene, n-hexitosiindene, 2-methyl-pentoxyindene, 3-methyl-pentoxyindene, and 4-methyl-pentoxyindene. As the indenes, the compounds exemplified above may be used singly or in combination of two or more kinds thereof.

Examples of the acenaphthylenes include acenaphthylene, alkylacenaphthylenes, halogenated acenaphthylenes, and phenylacenaphthylenes. Examples of the alkyl acenaphthylenes include 1-methyl acenaphthylene, 3-methyl acenaphthylene, 4-methyl acenaphthylene, 5-methyl acenaphthylene, 1-ethyl acenaphthylene, 3-ethyl acenaphthylene, 4-ethyl acenaphthylene, and 5-ethyl acenaphthylene. Examples of the halogenated acenaphthylenes include 1-chloroacenaphthylene, 3-chloroacenaphthylene, 4-chloroacenaphthylene, 5-chloroacenaphthylene, 1-bromoacenaphthylene, 3-bromoacenaphthylene, 4-bromoacenaphthylene, and 5-bromoacenaphthylene. Examples of the phenylacenaphthylenes include 1-phenylacenaphthylene, 3-phenylacenaphthylene, 4-phenylacenaphthylene, and 5-phenylacenaphthylene. As the acenaphthylenes, the compounds exemplified above may be used singly or in combination of two or more kinds thereof.

When the aromatic polymer has not only a structural unit derived from the bifunctional aromatic compound but also another structural unit, the aromatic polymer is a copolymer of a structural unit derived from the bifunctional aromatic compound and another structural unit such as a structural unit derived from the monofunctional aromatic compound. This copolymer may be a block copolymer or a random copolymer.

The polymer is not particularly limited as long as it is a polymer having the structural unit represented by Formula (1) in the molecule as described above. It is preferable that the structural unit represented by Formula (1) includes a structural unit represented by the following Formula (2). In other words, the polymer is preferably a polymer having a structural unit represented by the following Formula (2) in the molecule.

[Chemical formula. 3]

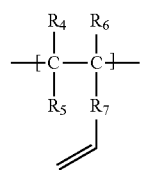

(2)

$R_4$ to $R_6$ in Formula (2) are similar to $R_4$ to $R_6$ in Formula (1). Specifically, $R_4$ to $R_6$ each independently represent a hydrogen atom or an alkyl group having 1 to 6 carbon atoms. $R_7$ represents an arylene group having 6 to 12 carbon atoms.

The arylene group having 6 to 12 carbon atoms in Formula (2) is not particularly limited. Examples of this arylene group include a monocyclic aromatic group such as a phenylene group and a bicyclic aromatic group in which the aromatic is not a monocyclic ring but a bicyclic aromatic such as a naphthalene ring. This arylene group also includes a derivative in which a hydrogen atom bonded to an aromatic ring is substituted with a functional group such as an alkenyl group, an alkynyl group, a formyl group, an alkylcarbonyl group, an alkenylcarbonyl group, or an alkynylcarbonyl group.

It is preferable that the structural unit represented by Formula (2) includes a structural unit represented by the following Formula (3). In other words, in the structural unit represented by Formula (2), $R_7$ is preferably a phenylene group. Among the phenylene groups, a p-phenylene group is more preferable.

[Chemical formula. 4]

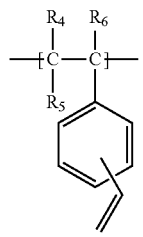

(3)

$R_4$ to $R_6$ in Formula (3) are similar to $R_4$ to $R_6$ in Formula (1). Specifically, $R_4$ to $R_6$ each independently represent a hydrogen atom or an alkyl group having 1 to 6 carbon atoms.

The polymer preferably includes a polymer further having a structural unit represented by the following Formula (4) in the molecule. In other words, it is preferable that the polymer has a structural unit derived from a monofunctional aromatic compound in which one carbon-carbon unsaturated double bond is bonded to an aromatic ring as the structural unit represented by the following Formula (4). Hence, the polymer is preferably a polymer having a structural unit represented by Formula (1) and a structural unit represented by the following Formula (4) in the molecule. In other words, the polymer may have a structural unit other than the structural unit represented by Formula (1) and the structural unit represented by the following Formula (4) (structural unit other than (1) and (4)) as long as it is a polymer having a structural unit represented by Formula (1) and the structural unit represented by the following Formula (4) in the molecule. The polymer may have a structural unit other than (1) and (4), the polymer may be a polymer in which a repeating unit in which the structural unit represented by Formula (1) is repeatedly bonded, a repeating unit in which the structural unit represented by the following Formula (4) is repeatedly bonded, and a repeating unit in which a structural unit other than (1) and (4) is repeatedly bonded are randomly bonded, or the polymer may be a block copolymer or a random copolymer.

[Chemical formula. 5]

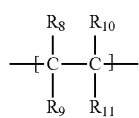

(4)

In Formula (4), $R_8$ to $R_{10}$ are independent of each other. In other words, $R_8$ to $R_{10}$ may be the same group as or different groups from each other. $R_8$ to $R_{10}$ represent a hydrogen atom or an alkyl group having 1 to 6 carbon atoms. $R_{11}$ represents an aryl group.

The alkyl group having 1 to 6 carbon atoms, which is represented by $R_8$ to $R_{10}$ in Formula (4), is not particularly limited and may be similar to the alkyl group having 1 to 6 carbon atoms, which is represented by $R_4$ to $R_6$ in Formula (1). Specific examples of the alkyl group having 1 to 6 carbon atoms, which is represented by $R_8$ to $R_{10}$ in Formula (4), include a methyl group, an ethyl group, a propyl group, and a hexyl group.

The aryl group in Formula (4) is not particularly limited and may be an unsubstituted aryl group or an aryl group in which a hydrogen atom bonded to an aromatic ring is substituted with an alkyl group or the like. The unsubstituted aryl group may be a group obtained by eliminating one hydrogen atom from an aromatic hydrocarbon having one aromatic ring or a group obtained by eliminating one hydrogen atom from an aromatic hydrocarbon having two or more independent aromatic rings (for example, biphenyl). Examples of the aryl group in Formula (4) include an unsubstituted aryl group having 6 to 12 carbon atoms and an arylene group having 6 to 18 carbon atoms in which a hydrogen atom of an aryl group having 6 to 12 carbon atoms is substituted with an alkyl group having 1 to 6 carbon atoms. Examples of the unsubstituted aryl group having 6 to 12 carbon atoms include a phenyl group, a naphthyl group, and a biphenylyl group. Specific examples of the aryl group in Formula (4), namely, $R_{11}$ include the aryl groups presented in the following Tables 1 and 2.

TABLE 1

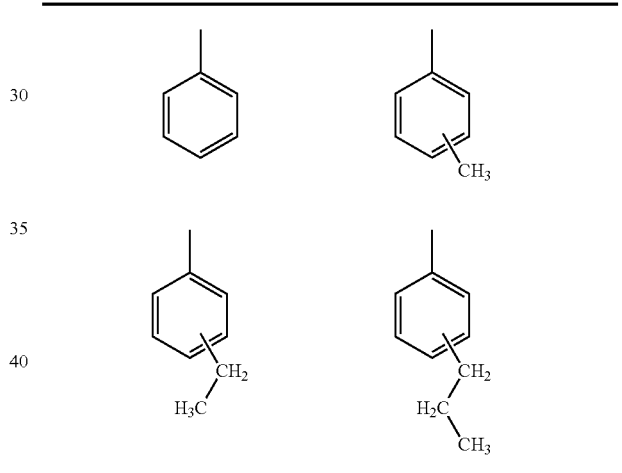

TABLE 2

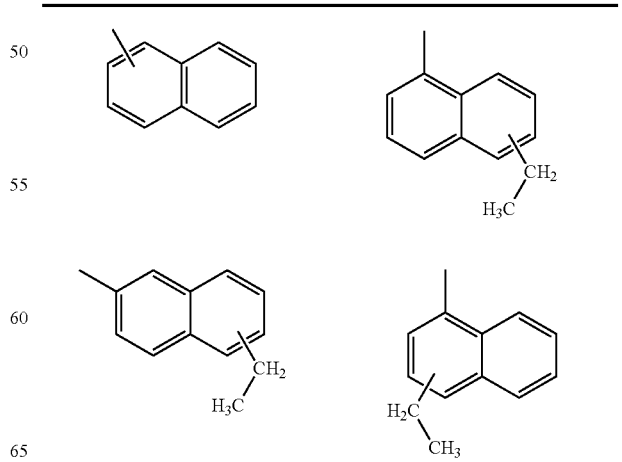

TABLE 2-continued

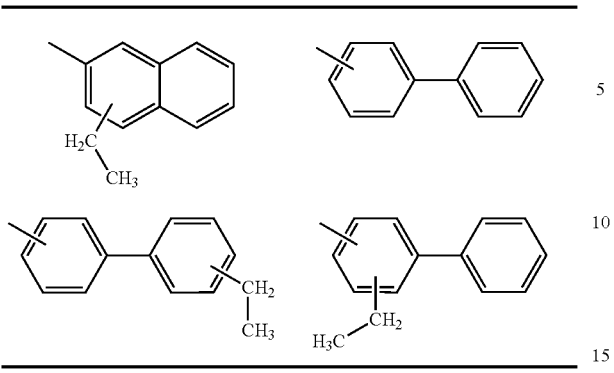

The weight average molecular weight of the polymer is preferably 1,500 to 40,000, or more preferably 1,500 to 35,000. When the weight average molecular weight is too low, the heat resistance and the like tend to decrease. When the weight average molecular weight is too high, the moldability and the like tend to decrease. Hence, when the weight average molecular weight of the resin composition is within the above range, excellent heat resistance and moldability are exhibited. Here, the weight average molecular weight is only required to be one measured by general molecular weight measurement, and specific examples thereof include a value measured by gel permeation chromatography (GPC).

In the polymer, when the sum of structural units in the polymer is 100 mol %, the molar content of the structural unit represented by Formula (1) is preferably a molar content within the range of the polymerization average molecular weight. Specifically, the molar content is preferably 2 to 95 mol %, more preferably 8 to 81 mol %. The molar content of the structural unit represented by Formula (2) and the molar content of the structural unit represented by Formula (3) are similar to the molar content of the structural unit represented by Formula (1). Specifically, the molar contents are preferably 2 to 95 mol %, more preferably 8 to 81 mol %. When the polymer is a polymer having a structural unit represented by Formula (1) and a structural unit represented by Formula (4) in the molecule, the molar content of the structural unit represented by Formula (1) is preferably 2 to 95 mol %, more preferably 8 to 81 mol % and the molar content of the structural unit represented by Formula (4) is preferably 5 to 98 mol %, more preferably 19 to 92 mol %.

In the polymer, the average number of structural units represented by Formula (1) is preferably a number within the range of the polymerization average molecular weight. Specifically, the average number is preferably 1 to 160, more preferably 3 to 140. The average number of structural units represented by Formula (2) and the average number of structural units represented by Formula (3) are similar to the average number of structural units represented by Formula (1). Specifically, the average number is preferably 1 to 160, more preferably 3 to 140. When the polymer is a polymer having a structural unit represented by Formula (1) and a structural unit represented by Formula (4) in the molecule, the average number of structural units represented by Formula (1) is preferably 1 to 160, more preferably 3 to 140 and the average number of structural units represented by Formula (4) is preferably 2 to 350, more preferably 4 to 300.

Specific examples of the polymer include a polymer having a structural unit represented by the following Formula (8) in the molecule and further at least one of a structural unit represented by the following Formula (7) and a structural unit represented by the following Formula (9). This polymer may be a block copolymer or a random copolymer.

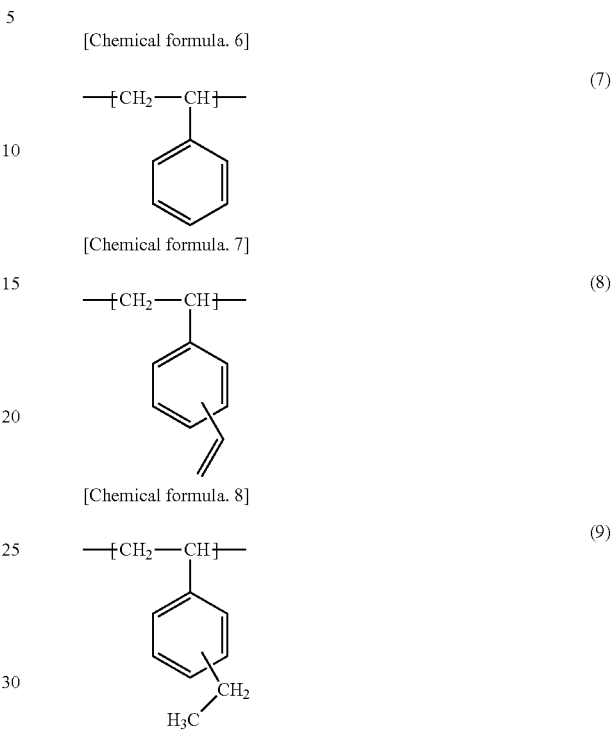

In the polymer having the structural unit represented by Formula (8) in the molecule and further at least one of the structural unit represented by Formula (7) and the structural unit represented by Formula (9), the molar contents of the structural unit represented by Formula (7), the structural unit represented by Formula (8), and the structural unit represented by Formula (9) are preferably 0 to 92 mol %, 8 to 54 mol %, and 0 to 89 mol %, respectively. The average number of structural units represented by Formula (7) is preferably 0 to 350, the average number of structural units represented by Formula (8) is preferably 1 to 160, and the average number of structural units represented by Formula (9) is preferably 0 to 270.

The equivalent of the vinyl group included in the structural unit represented by Formula (1), where $R_1$ to $R_3$ are a hydrogen atom, of the polymer is preferably 250 to 1200, more preferably 300 to 1100. When the equivalent is too small, the number of the vinyl groups is too large, the reactivity is too high, and for example, troubles such as the decrease in storage stability of the resin composition or the decrease in fluidity of the resin composition may occur. When a resin composition in which the equivalent is too small is used, for example, molding defects such as generation of voids at the time of multilayer molding may occur by insufficient fluidity and the like and a problem with moldability that a highly reliable wiring board is hardly obtained may occur. When the equivalent is too large, the number of the vinyl groups is too small and the heat resistance of the cured product tends to be insufficient. Hence, when the equivalent is within the above range, excellent heat resistance and moldability are exhibited. The equivalent of the vinyl group included in the structural unit represented by Formula (1), where $R_1$ to $R_3$ are a hydrogen atom, is a so-called vinyl equivalent.

(Modified PPE Compound)

In addition to the polymer, the resin composition of the present embodiment may further contain a modified polyphenylene ether compound of which the terminal is modified with a group represented by the following Formula (5) or (6).

[Chemical formula. 9]

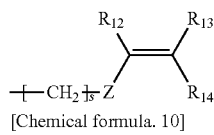
(5)

[Chemical formula. 10]

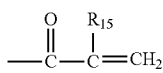
(6)

This makes it possible to obtain a laminate plate exhibiting excellent low dielectric properties such as lower dielectric constant and dielectric loss tangent, and the laminate plate is considered to be significantly useful as various electronic materials.

In Formula (5), s represents an integer 0 to 10. Z represents an arylene group, and $R_{12}$ to $R_{14}$ are independent of each other. In other words, $R_{12}$ to $R_{14}$ may be the same group as or different groups from each other. $R_{12}$ to $R_{14}$ represent a hydrogen atom or an alkyl group.

In a case where p in Formula (6) is 0, it indicates that Z is directly bonded to the terminal of polyphenylene ether.

This arylene group is not particularly limited. Examples of this arylene group include a monocyclic aromatic group such as a phenylene group, and a polycyclic aromatic group in which the aromatic is not a single ring but a polycyclic aromatic such as a naphthalene ring. This arylene group also includes a derivative in which a hydrogen atom bonded to an aromatic ring is substituted with a functional group such as an alkenyl group, an alkynyl group, a formyl group, an alkylcarbonyl group, an alkenylcarbonyl group, or an alkynylcarbonyl group. The alkyl group is not particularly limited and is, for example, preferably an alkyl group having 1 to 18 carbon atoms, more preferably an alkyl group having 1 to 10 carbon atoms. Specific examples thereof include a methyl group, an ethyl group, a propyl group, a hexyl group, and a decyl group.

In Formula (6), $R_{15}$ represents a hydrogen atom or an alkyl group. The alkyl group is not particularly limited and is, for example, preferably an alkyl group having 1 to 18 carbon atoms, more preferably an alkyl group having 1 to 10 carbon atoms. Specific examples thereof include a methyl group, an ethyl group, a propyl group, a hexyl group, and a decyl group. Examples of the substituent represented by Formula (6) include an acrylate group and a methacrylate group.

Examples of the substituent having a vinylbenzyl group include a substituent represented by the following Formula (10).

[Chemical formula. 11]

(10)

More specific examples of the group represented by Formula (10) include vinylbenzyl groups (ethenylbenzyl groups) such as a p-ethenylbenzyl group and an m-ethenylbenzyl group, a vinylphenyl group, an acrylate group, and a methacrylate group.

It is preferable that the modified polyphenylene ether compound has a polyphenylene ether chain in the molecule and has, for example, a repeating unit represented by the following Formula (11) in the molecule.

[Chemical formula. 12]

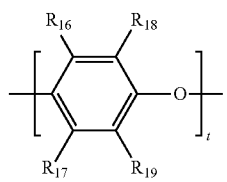
(11)

In Formula (11), t represents 1 to 50. $R_{16}$ to $R_{19}$ are independent of each other. In other words, $R_{16}$ to $R_{19}$ may be the same group as or different groups from each other. $R_{16}$ to $R_{19}$ represent a hydrogen atom, an alkyl group, an alkenyl group, an alkynyl group, a formyl group, an alkylcarbonyl group, an alkenylcarbonyl group, or an alkynylcarbonyl group. Among these, a hydrogen atom and an alkyl group are preferable.

Specific examples of the respective functional groups mentioned in $R_{16}$ to $R_{19}$ include the following.

The alkyl group is not particularly limited and is, for example, preferably an alkyl group having 1 to 18 carbon atoms, more preferably an alkyl group having 1 to 10 carbon atoms. Specific examples thereof include a methyl group, an ethyl group, a propyl group, a hexyl group, and a decyl group.

The alkenyl group is not particularly limited and is, for example, preferably an alkenyl group having 2 to 18 carbon atoms, more preferably an alkenyl group having 2 to 10 carbon atoms. Specific examples thereof include a vinyl group, an allyl group, and a 3-butenyl group.

The alkynyl group is not particularly limited and is, for example, preferably an alkynyl group having 2 to 18 carbon atoms, more preferably an alkynyl group having 2 to 10 carbon atoms. Specific examples thereof include an ethynyl group and a prop-2-yn-1-yl group (propargyl group).

The alkylcarbonyl group is not particularly limited as long as it is a carbonyl group substituted with an alkyl group and is, for example, preferably an alkylcarbonyl group having 2 to 18 carbon atoms, more preferably an alkylcarbonyl group having 2 to 10 carbon atoms. Specific examples thereof include an acetyl group, a propionyl group, a butyryl group, an isobutyryl group, a pivaloyl group, a hexanoyl group, an octanoyl group, and a cyclohexylcarbonyl group.

The alkenylcarbonyl group is not particularly limited as long as it is a carbonyl group substituted with an alkenyl group and is, for example, preferably an alkenylcarbonyl group having 3 to 18 carbon atoms, more preferably an alkenylcarbonyl group having 3 to 10 carbon atoms. Specific examples thereof include an acryloyl group, a methacryloyl group, and a crotonoyl group.

The alkynylcarbonyl group is not particularly limited as long as it is a carbonyl group substituted with an alkynyl group and is, for example, preferably an alkynylcarbonyl group having 3 to 18 carbon atoms, more preferably an alkynylcarbonyl group having 3 to 10 carbon atoms. Specific examples thereof include a propioloyl group.

The weight average molecular weight (Mw) of the modified polyphenylene ether compound used in the present embodiment is not particularly limited. Specifically, the weight average molecular weight is preferably 500 to 5000, more preferably 800 to 4000, and still more preferably 1000 to 3000. The weight average molecular weight here may be measured by a general molecular weight measurement method, and specific examples thereof include a value measured by gel permeation chromatography (GPC). In a case where the modified polyphenylene ether compound has a repeating unit represented by Formula (8) in the molecule, t is preferably a numerical value so that the weight average molecular weight of the modified polyphenylene ether compound is in such a range. Specifically, t is preferably 1 to 50.

When the weight average molecular weight of the modified polyphenylene ether compound is in such a range, the modified polyphenylene ether compound exhibits the excellent low dielectric properties of polyphenylene ether and not only imparts superior heat resistance to the cured product but also exhibits excellent moldability. This is considered to be due to the following. When the weight average molecular weight of ordinary polyphenylene ether is in such a range, the heat resistance of the cured product tends to decrease since the molecular weight is relatively low. With regard to this point, since the modified polyphenylene ether compound according to the present embodiment has one or more unsaturated double bonds at the terminal, it is considered that a cured product exhibiting sufficiently high heat resistance is obtained. Moreover, when the weight average molecular weight of the modified polyphenylene ether compound is in such a range, the modified polyphenylene ether compound has a relatively low molecular weight and thus is considered to exhibit excellent moldability. Hence, it is considered that such a modified polyphenylene ether compound is not only excellent in heat resistance of the cured product but also excellent in moldability.

Moreover, the average number of the substituents at the molecular terminal (the number of terminal functional groups) per one molecule of modified polyphenylene ether in the modified polyphenylene ether compound to be used in the present embodiment is not particularly limited. Specifically, the number is preferably 1 to 5, more preferably 1 to 3, still more preferably 1.5 to 3. When this number of functional groups is too small, sufficient heat resistance of the cured product tends to be hardly attained. When the number of terminal functional groups is too large, the reactivity is too high and, for example, troubles such as the decrease in storage stability of the resin composition or the decrease in fluidity of the resin composition may occur. In other words, when such a modified polyphenylene ether is used, for example, molding defects such as generation of voids at the time of multilayer molding occur by insufficient fluidity and the like and a problem of moldability that a highly reliable printed wiring board is hardly obtained may occur.

The number of terminal functional groups in the modified polyphenylene ether compound includes a numerical value expressing the average value of the substituents per one molecule of all the modified polyphenylene ether compounds existing in 1 mole of the modified polyphenylene ether compound. This number of terminal functional groups can be determined, for example, by measuring the number of hydroxyl groups remaining in the obtained modified polyphenylene ether compound and calculating the number of hydroxyl groups decreased from the number of hydroxyl groups in the polyphenylene ether before being modified. The number of hydroxyl groups decreased from the number of hydroxyl groups in the polyphenylene ether before being modified is the number of terminal functional groups. With regard to the method for measuring the number of hydroxyl groups remaining in the modified polyphenylene ether compound, the number of hydroxyl groups can be determined by adding a quaternary ammonium salt (tetraethylammonium hydroxide) to be associated with a hydroxyl group to a solution of the modified polyphenylene ether compound and measuring the UV absorbance of the mixed solution.

The intrinsic viscosity of the modified polyphenylene ether compound used in the present embodiment is not particularly limited. Specifically, the intrinsic viscosity may be 0.03 to 0.12 dl/g and is preferably 0.04 to 0.11 dl/g, more preferably 0.06 to 0.095 dl/g. When the intrinsic viscosity is too low, the molecular weight tends to be low and low dielectric properties such as a low dielectric constant and a low dielectric loss tangent tend to be hardly attained. When the intrinsic viscosity is too high, the viscosity is high, sufficient fluidity is not attained, and the moldability of the cured product tends to decrease. Hence, if the intrinsic viscosity of the modified polyphenylene ether compound is in the above range, excellent heat resistance and moldability of the cured product can be realized.

The intrinsic viscosity here is an intrinsic viscosity measured in methylene chloride at 25° C. and more specifically is, for example, a value acquired by measuring the intrinsic viscosity of a methylene chloride solution (liquid temperature: 25° C.) at 0.18 g/45 ml using a viscometer. Examples of the viscometer include AVS500 Visco System manufactured by SCHOTT Instruments GmbH.

More specific examples of the modified polyphenylene ether compound include a modified polyphenylene ether compound represented by the following Formula (12) and a modified polyphenylene ether compound represented by the following Formula (13). Moreover, as the modified polyphenylene ether compound, these modified polyphenylene ether compounds may be used singly or two kinds of these modified polyphenylene ether compounds may be used in combination.

[Chemical formula. 13]

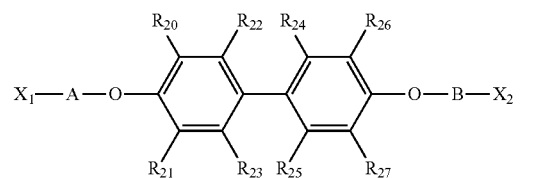

(12)

[Chemical formula. 14]

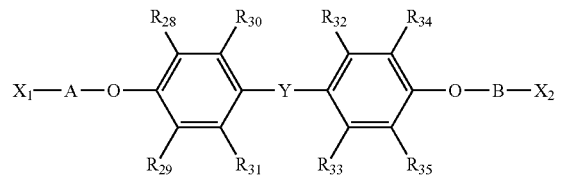

(13)

In Formulas (12) and (13), $R_{20}$ to $R_{27}$ and $R_{28}$ to $R_{35}$ each independently represent a hydrogen atom, an alkyl group, an alkenyl group, an alkynyl group, a formyl group, an alkylcarbonyl group, an alkenylcarbonyl group, or an alkynylcarbonyl group. $X_1$ and $X_2$ are each independently a group represented by Formula (5) or (6). A and B represent a repeating unit represented by the following Formula (14) and a repeating unit represented by the following Formula (15), respectively. In Formula (13), Y represents a linear, branched, or cyclic hydrocarbon having 20 or less carbon atoms.

[Chemical formula. 15]

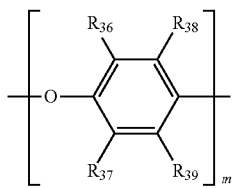
(14)

[Chemical formula. 16]

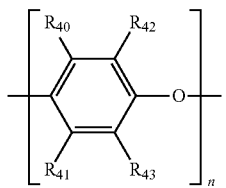
(15)

In Formulas (14) and (15), m and n each represent 0 to 20. $R_{36}$ to $R_{39}$ and $R_{40}$ to $R_{43}$ each independently represent a hydrogen atom, an alkyl group, an alkenyl group, an alkynyl group, a formyl group, an alkylcarbonyl group, an alkenylcarbonyl group, or an alkynylcarbonyl group.

The modified polyphenylene ether compound represented by Formula (12) and the modified polyphenylene ether compound represented by Formula (13) are not particularly limited as long as they satisfy the above configuration. Specifically, in Formulas (12) and (13), $R_{20}$ to $R_{27}$ and $R_{28}$ to $R_{35}$ are independent of each other as described above. In other words, $R_{20}$ to $R_{27}$ and $R_{28}$ to $R_{35}$ may be the same group as or different groups from each other. $R_{20}$ to $R_{27}$ and $R_{28}$ to $R_{35}$ represent a hydrogen atom, an alkyl group, an alkenyl group, an alkynyl group, a formyl group, an alkylcarbonyl group, an alkenylcarbonyl group, or an alkynylcarbonyl group. Among these, a hydrogen atom and an alkyl group are preferable.

In Formulas (14) and (15), m and n each preferably represent 0 to 20 as described above. Furthermore, it is preferable that m and n represent numerical values so that the sum of m and n is 1 to 30. Hence, it is more preferable that m represents 0 to 20, n represents 0 to 20, and the sum of m and n represents 1 to 30. $R_{36}$ to $R_{39}$ and $R_{40}$ to $R_{43}$ are independent of each other. In other words, $R_{36}$ to $R_{39}$ and $R_{40}$ to $R_{43}$ may be the same group as or different groups from each other. $R_{36}$ to $R_{39}$ and $R_{40}$ to $R_{43}$ represent a hydrogen atom, an alkyl group, an alkenyl group, an alkynyl group, a formyl group, an alkylcarbonyl group, an alkenylcarbonyl group, or an alkynylcarbonyl group. Among these, a hydrogen atom and an alkyl group are preferable.

$R_{20}$ to $R_{43}$ are the same as $R_{16}$ to $R_{19}$ in Formula (11).

In Formula (13), Y represents a linear, branched, or cyclic hydrocarbon having 20 or less carbon atoms as described above. Examples of Y include a group represented by the following Formula (16).

[Chemical formula. 17]

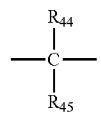
(16)

In Formula (16), $R_{44}$ and $R_{45}$ each independently represent a hydrogen atom or an alkyl group. Examples of the alkyl group include a methyl group. Examples of the group represented by Formula (16) include a methylene group, a methylmethylene group, and a dimethylmethylene group. Among these, a dimethylmethylene group is preferable.

In Formulas (12) and (13), $X_1$ and $X_2$ are each independently a group represented by Formula (5) or (6). In the modified polyphenylene ether compound represented by Formula (12) and the modified polyphenylene ether compound represented by Formula (13), $X_1$ and $X_2$ may be the same substituent as or different substituents from each other.

More specific examples of the modified polyphenylene ether compound represented by Formula (12) include a modified polyphenylene ether compound represented by the following Formula (17).

[Chemical formula. 18]

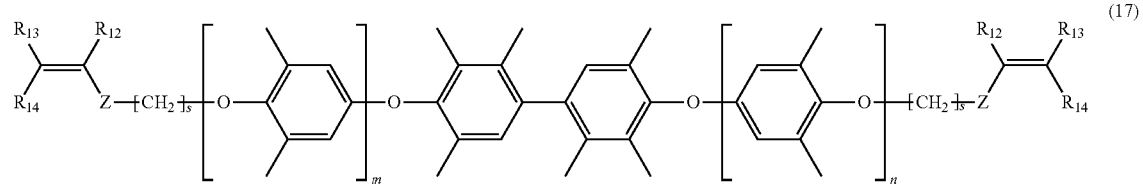
(17)

More specific examples of the modified polyphenylene ether compound represented by Formula (13) include a modified polyphenylene ether compound represented by the following Formula (18) and a modified polyphenylene ether compound represented by the following Formula (19).

[Chemical formula. 19]

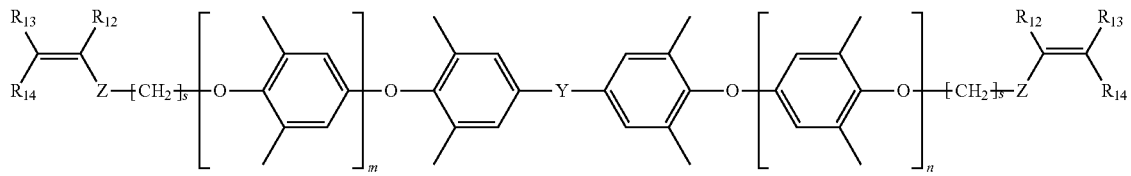

(18)

[Chemical formula. 20]

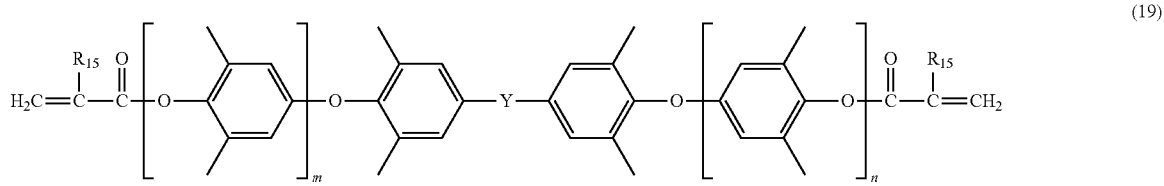

(19)

In Formulas (17) to (19), m and n are the same as m and n in Formulas (14) and (15). In Formulas (17) and (18), $R_{12}$ to $R_{14}$ and s are the same as $R_{12}$ to $R_{14}$ and s in Formula (5). In Formulas (18) and (19), Y is the same as Y in Formula (13). In Formula (19), $R_{15}$ is the same as $R_{15}$ in Formula (6).

The average number of the substituents at the molecular terminal (the number of terminal functional groups) per one molecule of the modified polyphenylene ether in the modified polyphenylene ether compound used in the present embodiment includes the range described above, but specifically the average number is preferably 1 to 2, more preferably 1.5 to 2, for example, in the case of the modified polyphenylene ether compounds represented by Formulas (17) to (19).

The method for synthesizing the modified polyphenylene ether compound used in the present embodiment is not particularly limited as long as a modified polyphenylene ether compound of which the terminal is modified with a group (hereinafter, also referred to as a substituent) represented by Formula (5) or (6) can be synthesized. Specific examples thereof include a method in which polyphenylene ether is reacted with a compound in which the substituent is bonded to a halogen atom.

Examples of the compound in which the substituent is bonded to a halogen atom include compounds in which substituents represented by Formulas (5) and (6) are bonded to a halogen atom. Specific examples of the halogen atom include a chlorine atom, a bromine atom, an iodine atom, and a fluorine atom. Among these, a chlorine atom is preferable. More specific examples of the compound in which the substituent is bonded to a halogen atom include chloromethylstyrenes such as o-chloromethylstyrene, p-chloromethylstyrene, and m-chloromethylstyrene.

Polyphenylene ether which is a raw material is not particularly limited as long as a predetermined modified polyphenylene ether compound can be finally synthesized. Specific examples thereof include those containing polyphenylene ether composed of 2,6-dimethylphenol and at least one of a bifunctional phenol and a trifunctional phenol and polyphenylene ether such as poly(2,6-dimethyl-1,4-phenylene oxide) as a main component. The bifunctional phenol is a phenol compound having two phenolic hydroxyl groups in the molecule, and examples thereof include tetramethyl bisphenol A. The trifunctional phenol is a phenol compound having three phenolic hydroxyl groups in the molecule. In particular, the polyphenylene ether compound of the present embodiment preferably contains a structure derived from 2,6-dimethylphenol and bifunctional phenol.

Examples of the method for synthesizing the modified polyphenylene ether compound include the methods described above. Specifically, polyphenylene ether as described above and a compound in which the substituent is bonded to a halogen atom are dissolved in a solvent and stirred. By doing so, polyphenylene ether reacts with the compound in which the substituent is bonded to a halogen atom, and the modified polyphenylene ether compound to be used in the present embodiment is obtained.

The reaction is preferably conducted in the presence of an alkali metal hydroxide. By doing so, it is considered that this reaction suitably proceeds. This is considered to be because the alkali metal hydroxide functions as a dehydrohalogenating agent, specifically, a dehydrochlorinating agent. In other words, it is considered that the alkali metal hydroxide eliminates the hydrogen halide from the phenol group in polyphenylene ether and the compound in which the substituent is bonded to a halogen atom, and by doing so, the substituent is bonded to the oxygen atom of the phenol group instead of the hydrogen atom of the phenol group in the polyphenylene ether.

The alkali metal hydroxide is not particularly limited as long as it can act as a dehalogenating agent, and examples thereof include sodium hydroxide. The alkali metal hydroxide is usually used in the form of an aqueous solution and is specifically used as an aqueous sodium hydroxide solution.

The reaction conditions such as reaction time and reaction temperature also vary depending on the compound in which the substituent is bonded to a halogen atom and the like, and are not particularly limited as long as they are conditions under which the reaction as described above suitably proceeds. Specifically, the reaction temperature is preferably room temperature to 100° C., more preferably 30° C. to 100° C. The reaction time is preferably 0.5 to 20 hours, more preferably 0.5 to 10 hours.

The solvent used at the time of the reaction is not particularly limited as long as it can dissolve polyphenylene ether and the compound in which the substituent is bonded to a halogen atom, and does not inhibit the reaction of polyphenylene ether with the compound in which the substituent is bonded to a halogen atom. Specific examples thereof include toluene.

The above reaction is preferably conducted in the presence of not only an alkali metal hydroxide but also a phase transfer catalyst. In other words, the above reaction is preferably conducted in the presence of an alkali metal hydroxide and a phase transfer catalyst. By doing so, it is considered that the above reaction more suitably proceeds. This is considered to be due to the following. This is considered to be because the phase transfer catalyst is a catalyst which has a function of taking in the alkali metal hydroxide, is soluble in both phases of a phase of a polar solvent such as water and a phase of a non-polar solvent such as an organic solvent, and can transfer between these phases. Specifically, in a case where an aqueous sodium hydroxide solution is used as an alkali metal hydroxide and an organic solvent, such as toluene, which is incompatible with water is used as a solvent, it is considered that even when the aqueous sodium hydroxide solution is dropped into the solvent subjected to the reaction, the solvent and the aqueous sodium hydroxide solution are separated from each other and the sodium hydroxide is hardly transferred to the solvent. In that case, it is considered that the aqueous sodium hydroxide solution added as an alkali metal hydroxide hardly contributes to the promotion of the reaction. In contrast, when the reaction is conducted in the presence of an alkali metal hydroxide and a phase transfer catalyst, it is considered that the alkali metal hydroxide is transferred to the solvent in the state of being taken in the phase transfer catalyst and the aqueous sodium hydroxide solution is likely to contribute to the promotion of the reaction. For this reason, when the reaction is conducted in the presence of an alkali metal hydroxide and a phase transfer catalyst, it is considered that the above reaction more suitably proceeds.

The phase transfer catalyst is not particularly limited, and examples thereof include quaternary ammonium salts such as tetra-n-butylammonium bromide.

The resin composition used in the present embodiment preferably contains a modified polyphenylene ether compound obtained as described above as a modified polyphenylene ether compound in addition to the polymer.

The resin composition of the present embodiment may contain a thermosetting resin other than a polymer and a polyphenylene ether compound as described above. Examples of usable another thermosetting resin include an epoxy resin, a phenol resin, an amine resin, an unsaturated polyester resin, and a thermosetting polyimide resin.

(Other Components)

The resin composition according to the present embodiment may contain components (other components) other than the polymer described above if necessary as long as the effects of the present invention are not impaired. As other components contained in the resin composition according to the present embodiment, for example, additives such as a curing agent, a silane coupling agent, a flame retardant, an initiator, an antifoaming agent, an antioxidant, a heat stabilizer, an antistatic agent, an ultraviolet absorber, a dye or pigment, a lubricant, and an inorganic filler may be further contained. In addition to the polymer, the resin composition may contain resins such as polyphenylene ether, an epoxy resin, an unsaturated polyester resin, and a thermosetting polyimide resin.

In particular, the curing agent is not particularly limited as long as it is a curing agent (crosslinking type crosslinking agent) capable of curing the resin composition by reacting with the polymer and, if necessary, the modified polyphenylene ether compound and being crosslinked with the polymer. Examples of the crosslinking type curing agent include a compound having two or more unsaturated double bonds in the molecule, an alkenyl isocyanurate compound, styrene, a styrene derivative, an allyl compound having at least one or more allyl groups in the molecule, a polyfunctional maleimide compound having at least two or more maleimide groups in the molecule, a modified maleimide compound, and an acenaphthylene compound having an acenaphthylene structure in the molecule.

Examples of the compound having two or more unsaturated double bonds in the molecule include a polyfunctional methacrylate compound having two or more methacryloyl groups in the molecule, a polyfunctional acrylate compound having two or more acryloyl groups in the molecule, and a polyfunctional vinyl compound having two or more vinyl groups in the molecule. Examples of the polyfunctional vinyl compound include divinylbenzene and polybutadiene. The alkenyl isocyanurate compound is only required to be a compound having an isocyanurate structure and an alkenyl group in the molecule, and examples thereof include trialkyl isocyanurate compounds such as triallyl isocyanurate (TAIC).

Examples of the styrene derivative include bromostyrene such as dibromostyrene. Examples of the modified maleimide compound include a modified maleimide compound in which a part of the molecule is amine-modified, a modified maleimide compound in which a part of the molecule is silicone-modified, and a modified maleimide compound in which a part of the molecule is amine-modified and silicone-modified.

Examples of the allyl compound include a monofunctional allyl compound having one allyl group in the molecule and a polyfunctional allyl compound having two or more allyl groups in the molecule. Examples of the polyfunctional allyl compound include diallyl phthalate (DAP).

The polyfunctional maleimide compound having at least two or more maleimide groups in the molecule is not particularly limited, but examples of the polyfunctional maleimide compound include phenylene bismaleimides such as 4,4'-diphenylmethane bismaleimide, polyphenylmethane maleimide, and m-phenylene bismaleimide, bisphenol A diphenyl ether bismaleimide, 3,3'-dimethyl-5,5'-diethyl-4,4'-diphenylmethane bismaleimide, 4-methyl-1,3-phenylene bismaleimide, 1,6'-bismaleimide-(2,2,4-trimethyl)hexane, 4,4'-diphenyl ether bismaleimide, 4,4'-diphenylsulphon bismaleimide, 1,3-bis(3-maleimide phenoxy)benzene, 1,3-bis(4-maleimide phenoxy)benzene, and a maleimide compound having a biphenyl structure. Examples of the modified maleimide compound include a modified maleimide compound in which the molecule has a maleimide group and a part of the molecule is modified with an amine compound, a modified maleimide compound in which a part of the molecule is modified with a silicone compound, and a modified maleimide compound in which a part of the molecule is amine-modified and silicone-modified with an amine compound and a silicone compound.

Examples of the acenaphthylene compound include acenaphthylene, alkylacenaphthylenes, halogenated acenaphthylenes, and phenylacenaphthylenes. Examples of the alkyl acenaphthylenes include 1-methyl acenaphthylene, 3-methyl acenaphthylene, 4-methyl acenaphthylene, 5-methyl acenaphthylene, 1-ethyl acenaphthylene, 3-ethyl acenaphthylene, 4-ethyl acenaphthylene, and 5-ethyl acenaphthylene. Examples of the halogenated acenaphthylenes include 1-chloroacenaphthylene, 3-chloroacenaphthylene, 4-chloroacenaphthylene, 5-chloroacenaphthylene, 1-bromoacenaphthylene, 3-bromoacenaphthylene, 4-bromoacenaphthylene, and 5-bromoacenaphthylene. Examples of the phenylacenaphthylenes include 1-phenylacenaphthylene, 3-phenylacenaphthylene, 4-phenylacenaphthylene, and 5-phenylacenaphthylene. The acenaphthylene compound may be a monofunctional acenaphthylene compound having one acenaphthylene structure in the molecule as described above or may be a polyfunctional acenaphthylene compound having two or more acenaphthylene structures in the molecule.

Among these, the alkenyl isocyanurate compound, the polyfunctional acrylate compound, the polyfunctional methacrylate compound, and the polyfunctional vinyl compound are preferable from the viewpoint that the heat resistance of the cured product of the resin composition can be further enhanced. It is considered that this is because crosslinking of the resin composition is more suitably formed by the curing reaction when using these crosslinking type curing agents. As the crosslinking type curing agent, the crosslinking type curing agents exemplified may be used singly or in combination of two or more kinds thereof. As the crosslinking type curing agent, not only the crosslinking type curing agents exemplified above such as the compound having two or more unsaturated double bonds in the molecule but also a compound having one unsaturated double bond in the molecule may be used concurrently. Examples of the compound having one unsaturated double bond in the molecule include a monovinyl compound having one vinyl group in the molecule.

Examples of the polyfunctional acrylate compound include a polyfunctional acrylate compound having two or more acryloyl groups in the molecule, and examples thereof include tricyclodecane dimethanol diacrylate.

Examples of the polyfunctional methacrylate compound include a compound having a polyphenylene ether structure and two or more methacryloyl groups in the molecule and tricyclodecane dimethanol dimethacrylate. Examples of the compound having a polyphenylene ether structure and two or more methacryloyl groups in the molecule include a methacryl-modified polyphenylene ether compound in which the terminal hydroxyl group of polyphenylene ether is modified with a methacrylic group.

As the curing agent, the above curing agents may be used singly or in combination of two or more kinds thereof.

The weight average molecular weight of the curing agent is preferably 100 to 5000, more preferably 100 to 4000, still more preferably 100 to 3000. When the weight average molecular weight of the curing agent is too low, the curing agent may easily volatilize from the compounding component system of the resin composition. When the weight average molecular weight of the curing agent is too high, the viscosity of the varnish of the resin composition and the melt viscosity at the time of heat molding may be too high. Hence, a resin composition imparting superior heat resistance to the cured product is obtained when the weight average molecular weight of the curing agent is within such a range. It is considered that this is because the resin composition of the present embodiment can be suitably cured by the reaction of the curing agent with the polymer and the modified polyphenylene ether compound. The weight average molecular weight here may be measured by a general molecular weight measurement method, and specific examples thereof include a value measured by gel permeation chromatography (GPC).

As described above, the resin composition according to the present embodiment may contain a silane coupling agent. The silane coupling agent may be contained in the resin composition or may be contained as a silane coupling agent covered on the inorganic filler to be contained in the resin composition for surface treatment in advance. Among these, it is preferable that the silane coupling agent is contained as a silane coupling agent covered on the inorganic filler for surface treatment in advance, and it is more preferable that the silane coupling agent is contained as a silane coupling agent covered on the inorganic filler for surface treatment in advance and further is also contained in the resin composition. In the case of a prepreg, the silane coupling agent may be contained in the prepreg as a silane coupling agent covered on the fibrous base material for surface treatment in advance.

Examples of the silane coupling agent include a silane coupling agent having at least one functional group selected from the group consisting of a vinyl group, a styryl group, a methacryloyl group, an acryloyl group, and a phenylamino group. In other words, examples of this silane coupling agent include compounds having at least one of a vinyl group, a styryl group, a methacryloyl group, an acryloyl group, or a phenylamino group as a reactive functional group, and further a hydrolyzable group such as a methoxy group or an ethoxy group.

Examples of the silane coupling agent include vinyltriethoxysilane and vinyltrimethoxysilane as those having a vinyl group. Examples of the silane coupling agent include p-styryltrimethoxysilane and p-styryltriethoxysilane as those having a styryl group. Examples of the silane coupling agent include 3-methacryloxypropyltrimethoxysilane, 3-methacryloxypropylmethyldimethoxysilane, 3-methacryloxypropyltriethoxysilane, 3-methacryloxypropylmethyldiethoxysilane, and 3-methacryloxypropylethyldiethoxysilane as those having a methacryloyl group. Examples of the silane coupling agent include 3-acryloxypropyltrimethoxysilane and 3-acryloxypropyltriethoxysilane as those having an acryloyl group. Examples of the silane coupling agent include N-phenyl-3-aminopropyltrimethoxysilane and N-phenyl-3-aminopropyltriethoxysilane as those having a phenylamino group.

As described above, the resin composition according to the present embodiment may contain a flame retardant. The flame retardancy of a cured product of the resin composition can be enhanced by containing a flame retardant. The flame retardant is not particularly limited. Specifically, in the field in which halogen-based flame retardants such as bromine-based flame retardants are used, for example, ethylenedipentabromobenzene, ethylenebistetrabromoimide, decabromodiphenyloxide, and tetradecabromodiphenoxybenzene which have a melting point of 300° C. or more are preferable. It is considered that the elimination of halogen at a high temperature and the decrease in heat resistance can be suppressed by the use of a halogen-based flame retardant. In the field of being required to be free of halogen, a phosphoric ester-based flame retardant, a phosphazene-based flame retardant, a bis(diphenylphosphine oxide)-based flame retardant, and a phosphinate-based flame retardant are exemplified. Specific examples of the phosphoric ester-based flame retardant include a condensed phosphoric ester such as dixylenyl phosphate. Specific examples of the phosphazene-based flame retardant include phenoxyphosphazene. Specific examples of the bis(diphenylphosphine oxide)-based flame retardant include xylylenebis(diphenylphosphine oxide). Specific examples of the phosphinate-based flame retardant include metal phosphinates such as aluminum dialkyl phosphinate. As the flame retardant, the flame retardants exemplified may be used singly or in combination of two or more kinds thereof.

As described above, the resin composition according to the present embodiment may contain an initiator (reaction initiator). When the resin composition contains only the polymer as well, the curing reaction may proceed. However, a reaction initiator may be added since there is a case in which it is difficult to raise the temperature until curing proceeds depending on the process conditions. The reaction initiator is not particularly limited as long as it can promote the curing reaction of the curing agent with the polymer and, if necessary, the modified polyphenylene ether compound. Specific examples thereof include oxidizing agents such as α, α'-di(t-butylperoxy)diisopropylbenzene, 2,5-dimethyl-2, 5-di(t-butylperoxy)-3-hexyne, benzoyl peroxide, 3,3',5,5'-tetramethyl-1,4-diphenoquinone, chloranil, 2,4,6-tri-t-butylphenoxyl, t-butylperoxyisopropyl monocarbonate, and azobisisobutyronitrile. A carboxylic acid metal salt and the like can be concurrently used if necessary. By doing so, the curing reaction can be further promoted. Among these, α,α'-di(t-butylperoxy)diisopropylbenzene is preferably used. α,α'-di(t-butylperoxy)diisopropylbenzene has a relatively high reaction initiation temperature and thus can suppress the promotion of the curing reaction at the time point at which curing is not required, for example, at the time of prepreg drying, and can suppress the decrease in storage stability of the resin composition. Furthermore, α,α'-di(t-butylperoxy)diisopropylbenzene exhibits low volatility, thus does not volatilize at the time of prepreg drying and storage, and exhibits favorable stability. In addition, the reaction initiators may be used singly or in combination of two or more kinds thereof.

As described above, the resin composition according to the present embodiment may contain a filler such as an inorganic filler. Examples of the filler include those to be added to enhance the heat resistance and flame retardancy of a cured product of the resin composition, but the filler is not particularly limited. The heat resistance, flame retardancy and the like can be further enhanced by containing a filler. Specific examples of the filler include silica such as spherical silica, metal oxides such as alumina, titanium oxide, and mica, metal hydroxides such as aluminum hydroxide and magnesium hydroxide, talc, aluminum borate, barium sulfate, and calcium carbonate. As the filler, silica, mica, and talc are preferable and spherical silica is more preferable among these. The filler may be used singly or in combination of two or more kinds thereof. The filler may be used as it is, or a filler subjected to a surface treatment with the silane coupling agent may be used. In a case where a filler is contained, the content percentage thereof (filler content) is preferably 30 to 270 mass %, more preferably 50 to 250 mass % with respect to the resin composition.

The content proportion of the polymer in the resin composition of the present embodiment is not particularly limited as long as it is a proportion at which a cured product that may be an insulating layer can be formed. The content proportion is, for example, preferably about 30 to 95 parts by mass, more preferably 40 to 90 parts by mass, still more preferably 50 to 90 parts by mass with respect to the total amount (100 parts by mass) of the resin composition.

For example, in a case where the resin composition of the present embodiment further contains a modified polyphenylene ether compound, the content of the compound is preferably about 5 to 30 parts by mass, more preferably 5 to 20 parts by mass, still more preferably 10 to 20 parts by mass with respect to the total amount (100 parts by mass) of the resin composition.

In the case of further containing a curing agent, the content proportion of the curing agent is, for example, preferably about 5 to 70 parts by mass, more preferably 10 to 70 parts by mass, still more preferably 10 to 50 parts by mass with respect to the total amount (100 parts by mass) of the resin composition.

The resin composition as described above is usually prepared in the form of a varnish and is often used as a resin varnish when a copper clad laminate is manufactured. Such a resin varnish is prepared, for example, as follows.

First, the respective components, such as a polymer, if necessary a modified polyphenylene ether compound and a curing agent, and further various additives, which can be dissolved in an organic solvent are added to the organic solvent and dissolved. At this time, heating may be performed if necessary. Thereafter, if necessary, components, such as an inorganic filler, which are not dissolved in the organic solvent are added to and dispersed in the solution until a predetermined dispersion state is achieved using a ball mill, a bead mill, a planetary mixer, a roll mill or the like, whereby a varnish-like resin composition is prepared. The organic solvent used here is not particularly limited as long as it dissolves the polymer, the curing agent and the like, and does not inhibit the curing reaction. Specific examples thereof include toluene, cyclohexanone, methyl ethyl ketone, and propylene glycol monomethyl ether acetate. These may be used singly or two or more kinds thereof may be used concurrently.

It is preferable that the insulating layer of the present embodiment further contains a glass base material in addition to a cured product of the resin composition. This provides advantages that it is possible to suppress processing troubles (cracking and the like), diminish dimensional changes, decrease linear expansion, or suppress warpage.

In a case where the insulating layer of the present embodiment contains a glass base material, the insulating layer may be used as a prepreg obtained by impregnating the glass base material with the above-described resin composition. Examples of the method for manufacturing such a prepreg include a method in which a glass base material is impregnated with the above-described resin varnish (resin composition prepared in the form of a varnish), and then dried.

The impregnation of a glass base material with the resin varnish is performed by immersion, coating and the like. If necessary, it is possible to repeat this impregnation a plurality of times. At this time, it is also possible to finally adjust the composition and resin amount to the desired composition and resin amount by repeating the impregnation using a plurality of resin varnishes having different compositions and concentrations.

The glass base material impregnated with the resin varnish is heated under desired heating conditions, for example, at 80° C. to 170° C. for 1 to 10 minutes to obtain a resin layer containing the resin composition before being cured (A stage) or a resin layer in a semi-cured state (B stage). After the resin varnish is applied (in the case of prepreg, the resin varnish is impregnated), the organic solvent can be volatilized from the varnish by heating to decrease or remove the organic solvent.

(Surface Treated Copper Foil)

As illustrated in FIG. 1, the surface treated copper foil according to the present embodiment is a surface treated copper foil including a finely roughened particle treatment layer 2 of copper on at least one surface side of a copper foil 1, in which the finely roughened particle treatment layer 2 is formed of fine copper particles having a particle size of 40 to 200 nm, a heat resistance treatment layer 3 containing nickel is provided on the finely roughened particle treatment layer 2, a rust prevention treatment layer 4 containing at least chromium is provided on the heat resistance treatment layer 3, a silane coupling agent treatment layer 5 is provided on the rust prevention treatment layer, and the amount of nickel attached in the heat resistance treatment layer is 30 to 60 mg/m$^2$.

With such a configuration, the adhesive property to the resin base material can be enhanced by providing a finely roughened particle treatment layer formed of finely roughened particles on the surface of the untreated copper foil, and both transmission properties and basic properties (adhesive property to the resin base material and heat resistance) can be achieved by adjusting the size of the finely roughened particles and particularly the amount of nickel attached in the heat resistance treatment layer.

Hereinafter, first, each configuration of the surface treated copper foil of the present embodiment will be specifically described.

(Copper Foil)

Hitherto, the copper foils used for rigid substrates and the like have been generally electrolytic copper foils and the copper foils used for flexible substrates and the like have been generally rolled copper foils. However, in recent years, electrolytic copper foils exhibiting properties similar to those of rolled copper foils have been developed particularly with the rise of the flexible substrate market. Currently, rolled copper foils and electrolytic copper foils are used regardless of the kind of substrate. Hence, the untreated copper foil used in the present embodiment is not limited to a rolled copper foil or an electrolytic copper foil, and any copper foil may be used.

(Finely Roughened Particle Treatment Layer)

The finely roughened particle treatment layer is a first surface treatment layer formed on the untreated copper foil, is a layer provided to increase the surface area and improve the peel strength to the resin base material, and is formed of fine copper particles having a particle size of 40 to 200 nm.

In the present embodiment, the particle size is used in the following meanings. In other words, copper particles are observed at a magnification of 80,000-fold while tilting the sample table by 40° using a field emission scanning electron microscope FE-SEM (JSM-7800F manufactured by JEOL Ltd.), and the heights of the observed copper particles are taken as the values of particle size. The particle size of the fine copper particles in the finely roughened particle treatment layer of the present embodiment has a maximum value of 200 nm and a minimum value of 40 nm in the range observed and measured by the above method.

The fine copper particle treatment layer in the present embodiment does not exclude that copper particles having a particle size of more than 200 nm and copper particles having a particle size of less than 40 nm are contained. However, the transmission loss may increase when there are a great number of particles larger than 200 nm, sufficient adhesive property may not be secured when there are a great number of particles smaller than 40 nm, and either of these cases is not preferable. For example, the fine copper particle treatment layer in the present embodiment preferably contains copper particles having a particle size of 40 to 200 nm at 90% or more, still more preferably 95% or more.

The finely roughened particle treatment layer can be formed by an electrolytic plating method.

The particle size of the fine copper particles of the present embodiment is strongly affected by the electrolytic current density as well as the bath composition for plating treatment. For example, the particle size of roughened particles tends to be small in a case where the electrolytic current density is high, and the particle size of roughened particles tends to be large in a case where the electrolytic current density is low. Hence, the electrolytic current density is required to be appropriately set in order to obtain roughened particles having a desired particle size.

Examples of the bath composition and electrolysis conditions for forming the finely roughened particle treatment layer of copper are presented below but are not particularly limited thereto.

(Bath Composition)

Copper sulfate pentahydrate: 10 to 70 g/L (particularly preferably 30 to 50 g/L)

Pentasodium diethylenetriaminepentaacetate (hereinafter DTPA·5Na):

50 to 150 g/L (particularly preferably 80 to 120 g/L)

pH: 3.0 to 6.0 (particularly preferably 3.5 to 5.5)

Sulfuric acid and sodium hydroxide are used to adjust pH (Electrolysis Conditions)

Current density: 0.5 to 10.0 A/dm$^2$ (particularly preferably 1.0 to 6.0 A/dm$^2$)

Electric quantity: 10 to 130 A·sec/dm$^2$ (particularly preferably 30 to 110 A·sec/dm$^2$)

Liquid temperature: 25° C. to 50° C. (particularly preferably 30° C. to 45° C.)

Anode: copper plate

The appropriate DTPA·5Na concentration is 50 to 150 g/L, but it is difficult to obtain a sufficient refinement effect and the roughened particles are coarse in a case where the DTPA·5Na concentration is out of this range, for example, less than 50 g/L. The current efficiency decreases, the deposited amount by the roughening treatment extremely decreases, the voltage also increases, and this is uneconomical when the DTPA·5Na concentration exceeds 150 g/L.

The electric quantity is preferably 10 to 130 A·sec/dm$^2$, and there are advantages that copper particles having a particle size of 40 to 200 nm can be obtained and adhesive property to the resin can be easily secured when the electric quantity is in this range. On the contrary, in a case where the electric quantity is less than 10 A·sec/dm$^2$, the number of copper particles having a particle size of less than 40 nm increases and the adhesive property may decrease. In a case where the electric quantity is more than 130 A·sec/dm$^2$, the particle shape is likely to be dendritic, the particle size is likely to be coarse, and as a result, troubles are caused that the sticking tendency to the untreated copper foil decreases, powders often fall, and the surface roughness of the laminated surface increases.

(Heat Resistance Treatment Layer)

The heat resistance treatment layer is a layer for heat resistance and rust prevention, which is provided to protect the copper foil including the finely roughened particle treatment layer from stress such as chemicals and heat, and is called a barrier treatment layer in some cases. The heat resistance treatment layer of the present embodiment contains nickel or nickel and phosphorus, and the amount of nickel attached in the heat resistance treatment layer is 30 to 60 mg/m$^2$.

As the amount of nickel attached is 30 to 60 mg/m$^2$, both the transmission properties and the basic properties can be achieved. When the amount of nickel attached is less than 30 mg/m$^2$, the heat resistance decreases, and for example, swelling occurs at the interface between the resin and the copper foil, and as a result, the adhesive property may decrease. When the amount of nickel attached exceeds 60 mg/m$^2$, the transmission loss may increase. A more preferable range of the amount of nickel attached is 40 to 50 mg/m$^2$.

In the present embodiment, the "attached amount" refers to the mass per unit area of nickel deposited by plating (for example, electrolytic plating) on the finely roughened particle treatment layer side of the copper foil. The attached amount can be measured by a method in which the copper foil to be treated is dissolved in nitric acid or the like, the solution is diluted, and the nickel concentration is analyzed using an ICP emission spectrophotometer.

The heat resistance treatment layer of the present embodiment is preferably formed of nickel (Ni) or nickel (Ni) and phosphorus (P).

The heat resistance treatment layer of the present embodiment is a second surface treatment layer formed after the finely roughened particle treatment layer has been formed, and can be formed by an electrolytic plating method. The amount of nickel attached can be adjusted by the current conditions when this electrolytic plating is performed.

Examples of the bath composition and electrolysis conditions for forming the heat resistance treatment layer of the present embodiment formed of nickel and phosphorus are presented below but are not particularly limited thereto.

(Bath Composition)
Nickel sulfate hexahydrate: 10 to 100 g/L (particularly preferably 20 to 60 g/L)
Sodium acetate trihydrate: 2 to 40 g/L (particularly preferably 5 to 30 g/L)
Sodium hypophosphate monohydrate: 0.1 to 10 g/L (particularly preferably 1.0 to 6.0 g/L)
pH: 3.0 to 5.5 (particularly preferably 3.5 to 5.0)
(Electrolysis Conditions)
Current density: 0.5 to 3.5 A/dm$^2$ (particularly preferably 1.0 to 2.0 A/dm$^2$)
Electric quantity: 1.8 to 2.7 A·sec/dm$^2$ (particularly preferably 2.0 to 2.5 A·sec/dm$^2$)
Liquid temperature: 25° C. to 50° C. (particularly preferably 30° C. to 40° C.)
Anode: insoluble electrode such as platinum group oxide coated titanium As a supply source of nickel ions, nickel sulfate hexahydrate, nickel chloride hexahydrate, nickel acetate tetrahydrate and the like can be used. As a supply source of phosphorus ions, sodium phosphite, sodium hypophosphite, nickel phosphite and the like can be used. Sodium sulfate may be added to impart conductivity.

(Rust Prevention Treatment Layer)

The rust prevention treatment layer is a layer provided to prevent oxidation at the time of heating and storage. The rust prevention treatment layer of the present embodiment contains at least chromium (Cr) and is called a chromate treatment layer in some cases. The rust prevention treatment layer may further contain zinc (Zn).

The rust prevention treatment layer of the present embodiment is a third surface treatment layer formed after the heat resistance treatment layer has been formed, and can be formed by an electrolytic plating method.

The bath composition for forming the rust prevention treatment layer of the present embodiment may be a known one, and examples thereof include a bath composition having hexavalent chromium such as chromic acid, sodium dichromate, and potassium dichromate. The form of chromium deposited after the formation of the rust prevention treatment layer is a state in which Cr(OH)$_3$ and Cr$_2$O$_3$ exist together, and chromium is not deposited in the form of hexavalent chromium that adversely affects the human body but is deposited in the form of trivalent chromium. The chromic acid solution may be alkaline or acidic.

As an alkaline chromic acid solution, an alkaline zinc chromate solution containing zinc ions and hexavalent chromium ions described in JP S58-15950 B may be used. By using this chromic acid solution, it is possible to improve the rust preventive property as compared with the rust prevention treatment layer formed from a chromium single acid solution.

Examples of the electrolysis bath and electrolysis conditions for forming the rust prevention treatment layer of the present embodiment include the bath composition and conditions as presented below, but are not limited thereto.

(Bath Composition)
Sodium dichromate: 2.5 to 60 g/L (particularly preferably 5 to 30 g/L)
Zinc ion: 0.25 to 16 g/L (particularly preferably 0.5 to 8 g/L)
Sodium hydroxide: 10 to 180 g/L (particularly preferably 20 to 90 g/L)
(Electrolysis Conditions)
Current density: 1.5 to 8.0 A/dm$^2$ (particularly preferably 3.0 to 4.0 A/dm$^2$)
Electric quantity: 4.5 to 6.5 A·sec/dm$^2$ (particularly preferably 5.0 to 6.0 A·sec/dm$^2$)
Liquid temperature: 25° C. to 50° C. (particularly preferably 30° C. to 40° C.)
Anode: insoluble electrode such as platinum group oxide coated titanium (Silane Coupling Agent Treatment Layer)

The silane coupling agent treatment layer of the present embodiment is a fourth surface treatment layer formed after the rust prevention treatment layer has been formed and is a layer provided to further improve the adhesive property to the resin base material. By further providing the silane coupling agent treatment layer, not only the peel strength can be improved but also the deterioration of the peel strength after the harsh test can be suppressed, the rust preventive property is also improved, and the copper foil for circuit board with excellent versatility is obtained.

The silane coupling agent treatment layer of the present embodiment can be formed by adding an appropriate amount of silane coupling agent to water or the like to prepare an aqueous solution and performing application of the aqueous solution by immersion treatment or spraying treatment, then washing with water, and drying. As the silane coupling agent, one selected from various kinds such as an epoxy group, an amino group, a mercapto group, a vinyl group, a methacryloxy group, and a styryl group can be used. However, various silane coupling agents have different properties from each other and are compatible with the base material, and it is required to appropriately select and use one.

Examples of the bath for forming the silane coupling agent treatment layer include the composition and conditions as presented below, but are not limited thereto.

(Bath Composition and Conditions)
γ-Aminopropyltriethoxysilane: 1 to 5 mL/L (particularly preferably 2 to 4 mL/L)
Liquid temperature: 25° C. to 35° C. (particularly preferably 28° C. to 32° C.)
Immersion time: 15 seconds

[Method for Manufacturing Copper Clad Laminate]

As the copper clad laminate of the present embodiment, a double-sided copper foil-clad or single-sided copper foil-clad laminate plate can be fabricated by, for example, stacking one or more prepregs containing the resin composition as described above, further stacking a copper foil as described above on either or both of the upper and lower surfaces so that the silane coupling agent layer comes into contact with the prepreg, and subjecting this stacked body to hot press molding for lamination and integration.

The heating and pressing conditions can be appropriately set depending on the thickness of the laminate plate to be manufactured, the kind of resin composition, and the like. For example, the temperature can be set to 170° C. to 220° C., the pressure can be set to 1.5 to 5.0 MPa, and the time can be set to 60 to 150 minutes.

<Copper Foil with Resin>

Figure 4:
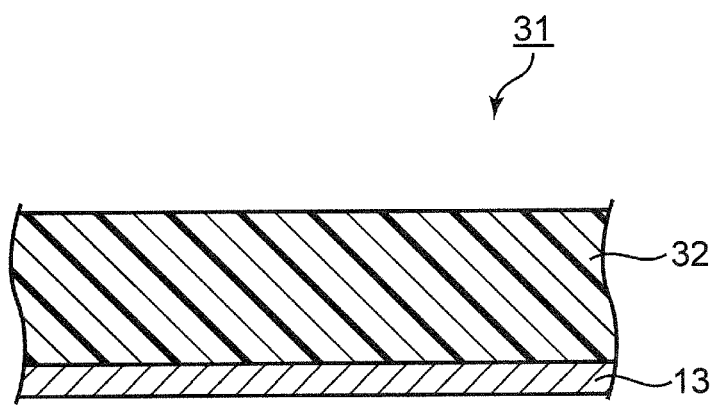
FIG. 4 is a schematic sectional view illustrating a configuration of a copper foil with resin according to an embodiment of the present invention.

A copper foil with resin 31 of the present embodiment has a configuration in which a resin layer 32 containing a resin composition or a semi-cured product of the resin composition and a copper foil 13 provided on one surface of the resin layer are laminated as described above (see FIG. 4). In other words, the copper foil with resin of the present embodiment may be a copper foil with resin including a resin layer containing a resin composition before being cured (A-stage resin composition) and a copper foil, or a copper foil with resin including a resin layer containing a semi-cured product of a resin composition (B-stage resin composition) and a copper foil.

As the resin composition used for the resin layer, and the copper foil, a resin composition and a copper foil similar to those described in the copper clad laminate can be used.

In the copper foil with resin of the present embodiment, the resin composition or a semi-cured product thereof may be the resin composition which has been dried or heat-dried.

Examples of the method for manufacturing the copper foil with resin include a method in which the resin varnish obtained above is applied to the surface on which the silane coupling agent layer has been formed of the copper foil, and then dried to semi-cure the resin composition.

Since the resin layer of the copper foil with resin usually does not contain a glass base material, the application of the resin varnish to the copper foil is performed by coating or the like, but coating can be repeated a plurality of times if necessary. At this time, it is also possible to finally adjust the composition (content ratio) and resin amount to the desired composition (content ratio) and resin amount by repeating coating using a plurality of resin varnishes having different compositions and concentrations.

In a case where the resin varnish is applied and then dried into a semi-cured state, a resin layer containing the resin composition before being cured (A stage) or a resin layer in a semi-cured state (B stage) is obtained by drying the resin varnish under desired heating conditions, for example, at 80° C. to 170° C. for 1 to 10 minutes. After the resin varnish is applied (in the case of prepreg, the resin varnish is impregnated), the organic solvent can be volatilized from the varnish by heating to decrease or remove the organic solvent.

The copper foil with resin of the present embodiment also has effects and advantages similar to those of the above-described copper clad laminate.

<Circuit Board>

Figure 3:
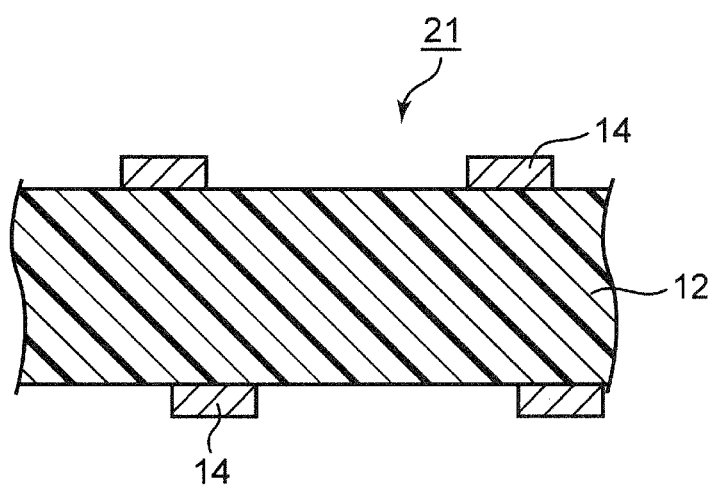
FIG. 3 is a schematic sectional view illustrating a configuration of a wiring board according to an embodiment of the present invention.

The copper clad laminate and copper foil with resin of the present embodiment can be used as a circuit board 21 in which a conductor pattern as a circuit 14 is provided on the surface by etching the copper foil on the surface to form a circuit as illustrated in FIG. 3. Examples of the method for forming a circuit include circuit formation by a semi-additive process (SAP) or a modified semi-additive process (MSAP) in addition to the method described above. The circuit board obtained using the copper clad laminate and copper foil with resin of the present embodiment is a highly reliable circuit board which exhibits heat resistance and has decreased transmission loss.

The present specification discloses various aspects of a technique as described above, but the main technique is summarized below.

The copper clad laminate according to an aspect of the present invention is a copper clad laminate including an insulating layer containing a cured product of a resin composition; and a surface treated copper foil on one surface or both surfaces of the insulating layer, in which the resin composition contains a polymer having a structural unit represented by the following Formula (1) in a molecule:

[Chemical formula. 21]

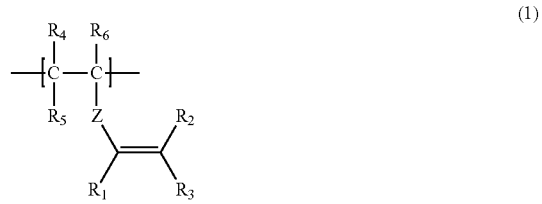

(1)

(in Formula (1), Z represents an arylene group, $R_1$ to $R_3$ each independently represent a hydrogen atom or an alkyl group, and $R_4$ to $R_6$ each independently represent a hydrogen atom or an alkyl group having 1 to 6 carbon atoms), and the surface treated copper foil includes a finely roughened particle treatment layer of copper on at least one surface side of a copper foil, in which the finely roughened particle treatment layer is formed of fine copper particles having a particle size of 40 to 200 nm, a heat resistance treatment layer containing nickel is provided on the finely roughened particle treatment layer, a rust prevention treatment layer containing at least chromium is provided on the heat resistance treatment layer, a silane coupling agent layer is provided on the rust prevention treatment layer, and an amount of nickel attached in the heat resistance treatment layer is 30 to 60 mg/m².

With such a configuration, it is possible to provide a copper clad laminate which can decrease the transmission loss of a high speed signal transmission substrate and exhibits excellent adhesive property and heat resistance.

In the resin composition, the structural unit represented by Formula (1) preferably includes a structural unit represented by the following Formula (2).

[Chemical formula. 22]

(2)

In Formula (2), $R_4$ to $R_6$ each independently represent a hydrogen atom or an alkyl group having 1 to 6 carbon atoms and $R_7$ represents an arylene group having 6 to 12 carbon atoms.

According to such a configuration, it is possible to obtain a copper clad laminate including an insulating layer exhibiting lower dielectric properties and higher heat resistance.

In the resin composition, the structural unit represented by Formula (2) preferably includes a structural unit represented by the following Formula (3).

[Chemical formula. 23]

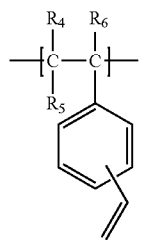

(3)

In Formula (3), $R_4$ to $R_6$ each independently represent a hydrogen atom or an alkyl group having 1 to 6 carbon atoms.

According to such a configuration, it is possible to obtain a copper clad laminate including an insulating layer exhibiting lower dielectric properties and higher heat resistance.

In the resin composition, the polymer preferably includes a polymer having a structural unit represented by the following Formula (4) in a molecule.

[Chemical formula. 24]

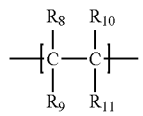

(4)

In Formula (4), $R_8$ to $R_{10}$ each independently represent a hydrogen atom or an alkyl group having 1 to 6 carbon atoms and $R_{11}$ represents an aryl group.

According to such a configuration, it is possible to obtain a copper clad laminate including an insulating layer exhibiting lower dielectric properties and higher heat resistance.

In the resin composition, the aryl group in the structural unit represented by Formula (4) preferably includes an aryl group having an alkyl group having 1 to 6 carbon atoms.

According to such a configuration, it is possible to obtain a copper clad laminate including an insulating layer exhibiting lower dielectric properties and higher heat resistance.

In the resin composition, the weight average molecular weight of the polymer is preferably 1,500 to 40,000.

According to such a configuration, it is possible to obtain a copper clad laminate including an insulating layer exhibiting lower dielectric properties and higher heat resistance.

In the resin composition, an equivalent of the vinyl group included in the structural unit represented by Formula (1), where $R_1$ to $R_3$ are a hydrogen atom, of the polymer is preferably 250 to 1200.

According to such a configuration, it is possible to obtain a copper clad laminate including an insulating layer exhibiting lower dielectric properties, higher heat resistance, and excellent moldability.

In the copper clad laminate, the resin composition preferably contains a modified polyphenylene ether compound of which the terminal is modified with the group represented by Formula (5) or (6). This makes it possible to obtain still excellent low dielectric properties.

In the surface treated copper foil, the heat resistance treatment layer is preferably formed of nickel or nickel and phosphorus. This makes it possible to more reliably obtain an effect as described above.

The copper foil with resin according to another aspect of the present invention includes a resin layer containing a resin composition as described above or a semi-cured product of the resin composition, and the above-described surface treated copper foil in contact with one surface of the resin layer.

The present invention also includes a circuit board including the copper clad laminate or the copper foil with resin, in which a conductor pattern as a circuit is provided on a surface of the circuit board.

The present invention also includes a resin composition for formation of an insulating layer in a copper clad laminate including the insulating layer containing a cured product of the resin composition and a surface treated copper foil on one surface or both surfaces of the insulating layer, the resin composition containing a polymer having a structural unit represented by the following Formula (1) in a molecule:

[Chemical formula. 25]

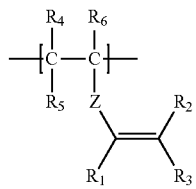

(1)

(in Formula (1), Z represents an arylene group, $R_1$ to $R_3$ each independently represent a hydrogen atom or an alkyl group, and $R_4$ to $R_6$ each independently represent a hydrogen atom or an alkyl group having 1 to 6 carbon atoms), and the surface treated copper foil includes a finely roughened particle treatment layer of copper on at least one surface side of a copper foil, wherein the finely roughened particle treatment layer is formed of fine copper particles having a particle size of 40 to 200 nm, a heat resistance treatment layer containing nickel is provided on the finely roughened particle treatment layer, a rust prevention treatment layer containing at least chromium is provided on the heat resistance treatment layer, a silane coupling agent layer is provided on the rust prevention treatment layer, and an amount of nickel attached in the heat resistance treatment layer is 30 to 60 mg/m$^2$.

Hereinafter, the present invention will be described more specifically with reference to Examples, but the scope of the present invention is not limited thereto.

Examples

The respective components used when preparing resin compositions in the present Examples will be first described.
Modified PPE1

Polyphenylene ether was reacted with chloromethylstyrene to obtain modified polyphenylene ether 1 (modified PPE1).

Specifically, first, 200 g of polyphenylene ether (polyphenylene ether, SA90 manufactured by SABIC Innovative Plastics, number of terminal hydroxyl groups: 2, weight average molecular weight Mw: 1700), 30 g of a mixture containing p-chloromethylstyrene and m-chloromethylstyrene at a mass ratio of 50:50 (chloromethylstyrene: CMS manufactured by Tokyo Chemical Industry Co., Ltd.), 1.227 g of tetra-n-butylammonium bromide as a phase transfer catalyst, and 400 g of toluene were introduced into a 1-liter three-necked flask equipped with a temperature controller, a stirrer, cooling equipment, and a dropping funnel and stirred. The mixture was stirred until polyphenylene ether, chloromethylstyrene, and tetra-n-butylammonium bromide were dissolved in toluene. At that time, the mixture was gradually heated until the liquid temperature finally reached 75° C. Thereafter, an aqueous sodium hydroxide solution (20 g of sodium hydroxide/20 g of water) as an alkali metal hydroxide was added dropwise to the solution over 20 minutes. Thereafter, the mixture was further stirred at 75° C. for 4 hours. Next, the resultant in the flask was neutralized with hydrochloric acid at 10 mass % and then a large amount of methanol was added into the flask. By doing so, a precipitate was generated in the liquid in the flask. In other words, the product contained in the reaction solution in the flask was reprecipitated. Thereafter, this precipitate was taken out by filtration, washed three times with a mixed solution of methanol and water contained at a mass ratio of 80:20, and then dried under reduced pressure at 80° C. for 3 hours. Thereafter, a terminal vinylbenzene modified PPE (modified PPE1) having a weight average molecular weight (Mw) of 2300 was obtained.

The obtained solid was analyzed by $^1$H-NMR (400 MHz, CDCl$_3$, TMS). As a result of NMR measurement, a peak attributed to ethenylbenzyl was observed at 5 to 7 ppm. By this, it was confirmed that the obtained solid was ethenylbenzylated polyphenylene ether.

Modified PPE2

Modified PPE2 was synthesized by a method similar to that for the synthesis of modified PPE1 except that polyphenylene ether described later was used as polyphenylene ether and the conditions described later were adopted.

The polyphenylene ether used was SA120 (intrinsic viscosity (IV): 0.125 dl/g, number of terminal hydroxyl groups: 1, weight average molecular weight Mw: 3100) manufactured by SABIC Innovative Plastics.

Next, the reaction between polyphenylene ether and chloromethylstyrene was conducted by a method similar to that for the synthesis of modified PPE1 except that 200 g of the polyphenylene ether (SA120), 15 g of CMS, and 0.92 g of a phase transfer catalyst (tetra-n-butylammonium bromide) were used and an aqueous sodium hydroxide solution (sodium hydroxide 10 g/water 10 g) was used instead of the aqueous sodium hydroxide solution (sodium hydroxide 20 g/water 20 g) to obtain terminal vinylbenzene modified PPE (modified PPE2) having a weight average molecular weight (Mw) of 3300.

The obtained solid was then analyzed by $^1$H-NMR (400 MHz, CDCl$_3$, TMS). As a result of NMR measurement, a peak attributed to ethenylbenzyl was observed at 5 to 7 ppm. By this, it was confirmed that the obtained solid was ethenylbenzylated polyphenylene ether.

SA9000: SA9000 manufactured by SABIC Innovative Plastics (terminal methacrylic group modified PPE, weight average molecular weight (Mw): 2000)

SA90: SA90 manufactured by SABIC Innovative Plastics (unmodified PPE, weight average molecular weight (Mw): 1700)

Polymer 1: polymer obtained by the following method.

Into a 5.0 L reactor, 2.9 mol (377 g) of divinylbenzene, 1.7 mol (224.4 g) of ethylvinylbenzene, 10.4 mol (1081.6 g) of styrene, and 15 mol (1532 g) of n-propyl acetate were added, and stirring was performed. The mixture obtained by this stirring was heated to 70° C., then 600 mmol of boron trifluoride-diethyl ether complex was added thereto, and stirring was performed at 70° C. for 4 hours to react divinylbenzene, ethylvinylbenzene, and styrene. Thereafter, a saturated aqueous sodium hydrogen carbonate solution was added to the reaction solution in the reactor to stop the reaction. The organic layer separated by the addition was washed with pure water three times. The washed organic layer was volatilized under reduced pressure at 60° C. to obtain polymer 1.

The obtained polymer 1 was a polymer having a structural unit represented by Formula (1) in the molecule [an aromatic polymer having a structural unit derived from a bifunctional aromatic compound in which two carbon-carbon unsaturated double bonds are bonded to an aromatic ring, a compound having structural units represented by Formulas (5) to (7), weight average molecular weight Mw: 26300, vinyl equivalent (equivalent of the vinyl group included in the structural unit represented by Formula (1), where $R_1$ to $R_3$ are a hydrogen atom: 510).

Polymer 2: polymer obtained by the following method.

Into a 5.0 L reactor, 3.6 mol (468 g) of divinylbenzene, 2.2 mol (290.4 g) of ethylvinylbenzene, 9.2 mol (956.8 g) of styrene, and 15 mol (1532 g) of n-propyl acetate were added, and stirring was performed. The mixture obtained by this stirring was heated to 70° C., then 600 mmol of boron trifluoride-diethyl ether complex was added thereto, and stirring was performed at 70° C. for 4 hours to react divinylbenzene, ethylvinylbenzene, and styrene. Thereafter, a saturated aqueous sodium hydrogen carbonate solution was added to the reaction solution in the reactor to stop the reaction. The organic layer separated by the addition was then washed with pure water three times. The washed organic layer was volatilized under reduced pressure at 60° C. to obtain polymer 2.

The obtained polymer 2 was a polymer having a structural unit represented by Formula (1) in the molecule [an aromatic polymer having a structural unit derived from a bifunctional aromatic compound in which two carbon-carbon unsaturated double bonds are bonded to an aromatic ring, a compound having structural units represented by Formulas (5) to (7), weight average molecular weight Mw: 31100, vinyl equivalent (equivalent of the vinyl group included in the structural unit represented by Formula (1), where $R_1$ to $R_3$ are a hydrogen atom: 380).

Polymer 3: polymer obtained by the following method.

Into a 5.0 L reactor, 3.9 mol (507 g) of divinylbenzene, 2.3 mol (303.6 g) of ethylvinylbenzene, 8.8 mol (915.2 g) of styrene, and 15 mol (1532 g) of n-propyl acetate were added, and stirring was performed. The mixture obtained by this stirring was heated to 70° C., then 600 mmol of boron trifluoride-diethyl ether complex was added thereto, and stirring was performed at 70° C. for 4 hours to react divinylbenzene, ethylvinylbenzene, and styrene. Thereafter, a saturated aqueous sodium hydrogen carbonate solution was added to the reaction solution in the reactor to stop the reaction. The organic layer separated by the addition was then washed with pure water three times. The washed organic layer was volatilized under reduced pressure at 60° C. to obtain polymer 3.

The obtained polymer 3 was a polymer having a structural unit represented by Formula (1) in the molecule [an aromatic polymer having a structural unit derived from a bifunctional aromatic compound in which two carbon-carbon unsaturated double bonds are bonded to an aromatic ring, a compound having structural units represented by Formulas (5) to (7), weight average molecular weight Mw: 39500, vinyl equivalent (equivalent of the vinyl group included in the structural unit represented by Formula (1), where $R_1$ to $R_3$ are a hydrogen atom: 320).

The equivalent (vinyl equivalent) of the vinyl group included in the structural unit represented by Formula (1), where $R_1$ to $R_3$ are a hydrogen atom, of the polymers 1 to 3 was calculated through iodine value measurement by the Wyeth method. Specifically, the compound to be measured was first dissolved in chloroform so that the concentration was 0.3 g/35 mL to 0.3 g/25 mL. Excess amount of iodine chloride was added to the double bonds present in this solution. By doing so, the double bond was reacted with iodine chloride, this reaction was allowed to proceed sufficiently, and then an aqueous potassium iodide solution at 20 mass % was added to the solution after being subjected to the reaction to extract the iodine component remaining in the solution after being subjected to the reaction into the aqueous phase in the form of $I_3^-$. This aqueous phase into which $I_3^-$ was extracted was titrated with an aqueous sodium thiosulfate solution (0.1 mol/L sodium thiosulfate standard solution), and the iodine value was calculated. The following equation was used to calculate the iodine value.

Iodine value=[($B-A$)×$F$×1.269]/mass of compound(g)

In the equation, B denotes the titration volume (cc) of the 0.1 mol/L sodium thiosulfate standard solution required for the blank test, A denotes the titration volume (cc) of 0.1 mol/L sodium thiosulfate standard solution required for neutralization, and F denotes the titer of sodium thiosulfate.

Curing agent 1: TAIC (triallyl isocyanurate manufactured by Nihon Kasei CO., LTD.)

Curing agent 2: Acenaphthylene (manufactured by JFE Chemical Corporation)

Curing agent 3: Dibromostyrene (manufactured by FUJI-FILM Wako Pure Chemical Corporation)

Reaction initiator: Perbutyl P: 1,3-di(t-butylperoxyisopropyl)benzene (Perbutyl P manufactured by NOF CORPORATION)

<Fabrication of Surface Treated Copper Foil>

(Surface Treated Copper Foil 1)

As a pretreatment, removal of the oxide layer on the surface of untreated copper foil and activation were performed by conducting electrolysis for 6 seconds at a current density of 5 A/dm² using a copper plate as the cathode and the above-mentioned untreated copper foil as the anode in a 100 g/L aqueous sulfuric acid solution.

Next, a finely roughened particle treatment layer of copper was formed on the laminated surface side of the untreated copper foil by performing the treatment under the following bath composition and electrolysis conditions.

(Bath Composition)
Copper sulfate pentahydrate: 35 g/L
Pentasodium diethylenetriaminepentaacetate: 100 g/L
pH4.8
(Electrolysis Conditions)
Current density: 6 A/dm²
Electric quantity: 50 A·sec/dm²
Liquid temperature: 30° C.
Electrode: copper plate The finely roughened particle treatment layer thus obtained was observed at a magnification of 80,000-fold while tilting the sample table by 40° using a field emission scanning electron microscope FE-SEM (JSM-7800F manufactured by JEOL Ltd.). The heights of the observed copper particles were taken as the values of the particle size, and as a result, the particle sizes of the roughened particles in the finely roughened particle treatment layer were 40 nm as a minimum value and 200 nm as a maximum value.

Subsequently, washing with water was performed, and then a heat resistance treatment layer, which is a second surface treatment layer, was formed by performing the treatment under the following bath composition and electrolysis conditions.

(Bath Composition)
Nickel sulfate hexahydrate: 30 g/L
Sodium acetate trihydrate: 10 g/L
Sodium hypophosphate monohydrate: 2.0 g/L
(Electrolysis Conditions)
Current density: 1.6 A/dm²
Electric quantity: 2.7 A·sec/dm²
pH4.5
Liquid temperature: 32° C.
Anode: platinum group oxide coated titanium plate The amount of nickel attached in the obtained heat resistance treatment layer was measured by dissolving the copper foil to be treated in nitric acid, diluting the solution, and analyzing the nickel concentration using an ICP emission spectrophotometer. As a result, the amount of nickel attached was 56 mg/m².

Subsequently, washing with water was performed, and then a rust prevention treatment layer to be a third surface treatment layer was formed by performing the treatment under the following electrolysis bath composition, pH, and electrolysis conditions.

(Bath Composition)
Sodium dichromate: 10 g/L
Zinc ion: 1.0 g/L
Sodium hydroxide: 40 g/L
Liquid temperature: 30° C.
(Electrolysis Conditions)
Current density: 4 A/dm²
Electric quantity: 5.5 A·sec/dm²
Anode: platinum group oxide coated titanium plate Subsequently, washing with water was performed, and then a silane coupling agent treatment layer to be a fourth surface treatment layer was formed by performing the treatment under the following bath composition, liquid temperature, and immersion time to obtain a surface treated copper foil of Example 1.

(Bath Composition)
γ-Aminopropyltriethoxysilane: 2 mL/L
Liquid temperature: 30° C.
Immersion time: 15 seconds (Surface Treated Copper Foil 2)

A surface treated copper foil 2 was obtained in the same manner as the surface treated copper foil 1 except that the second heat resistance treatment layer was formed by performing the treatment under the following bath composition and electrolysis conditions. The amount of nickel attached in the obtained heat resistance treatment layer was 32 mg/m².

(Bath Composition)
Nickel sulfate hexahydrate: 30 g/L
Sodium acetate trihydrate: 10 g/L
Sodium hypophosphate monohydrate: 2.0 g/L
pH4.5
(Electrolysis Conditions)
Current density: 1.0 A/dm²
Electric quantity: 1.8 A·sec/dm²
Liquid temperature: 32° C.
Electrode: platinum group oxide coated titanium plate (Surface Treated Copper Foil 3)

A surface treated copper foil 3 was obtained in the same manner as the surface treated copper foil 1 except that the second heat resistance treatment layer was not provided. The amount of nickel attached in the obtained surface treated copper foil 3 was 0 mg/m².

(Surface Treated Copper Foil 4)

A surface treated copper foil 4 was obtained in the same manner as the surface treated copper foil 1 except that the second heat resistance treatment layer was formed by performing the treatment under the following bath composition and electrolysis conditions. The amount of nickel attached in the obtained heat resistance treatment layer was 82 mg/m².

(Bath Composition)
Nickel sulfate hexahydrate: 30 g/L
Sodium acetate trihydrate: 10 g/L
Sodium hypophosphate monohydrate: 2.0 g/L
(Electrolysis Conditions)
Current density: 2.1 A/dm²
Electric quantity: 3.6 A·sec/dm²
pH4.5
Liquid temperature: 32° C.
Anode: platinum group oxide coated titanium plate (Surface Treated Copper Foil 5)

"T4X-SV" manufactured by FUKUDA METAL FOIL & POWDER CO., LTD. was used as a surface treated copper foil 5. The amount of nickel attached in the heat resistance treatment layer of this surface treated copper foil was 106 mg/m².

(Surface Treated Copper Foil 6)

A surface treated copper foil 6 was obtained in the same manner as the surface treated copper foil 1 except that the first finely roughened particle treatment layer was formed by performing the treatment under the following bath composition and electrolysis conditions. The particle sizes of the roughened particles in the obtained finely roughened particle treatment layer were 700 nm as a minimum value and 1400 nm as a maximum value. The amount of nickel attached in the obtained heat resistance treatment layer was 32 mg/m².

(Bath Composition)
Bath (1) Copper sulfate pentahydrate: 47 g/L
   Sulfuric acid: 100 g/L
Bath (2) Copper sulfate pentahydrate: 200 g/L
   Sulfuric acid: 100 g/L
(Electrolysis Conditions)

Fine copper particles were attached by performing electrolysis in the bath (1) under electrolysis conditions of a current density of 50 A/dm², an electric quantity of 130 A·sec/dm², and a liquid temperature of 30° C., and then electrolysis was further performed in the bath (2) under electrolysis conditions of a current density of 5 A/dm², an electric quantity of 400 A·sec/dm², and a liquid temperature of 40° C. to form a finely roughened particle treatment layer.

(Surface Treated Copper Foil 7)

A surface treated copper foil 7 was obtained in the same manner as the surface treated copper foil 1 except that the second heat resistance treatment layer was formed by performing the treatment under the following bath composition and electrolysis conditions and that a rust prevention treatment layer was not formed. The amount of nickel attached in the obtained heat resistance treatment layer was 42 mg/m².

(Bath Composition)
Nickel sulfate hexahydrate: 30 g/L
Sodium acetate trihydrate: 10 g/L
Sodium hypophosphate monohydrate: 2.0 g/L
(Electrolysis Conditions)
Current density: 1.3 A/dm²
Electric quantity: 2.3 A·sec/dm²
pH4.5
Liquid temperature: 32° C.
Anode: platinum group oxide coated titanium plate <Fabrication of Copper Clad Laminates of Examples 1 to 12 and Comparative Examples 1 to 8>

First, the respective components other than the initiator were added to and mixed in toluene at the compositions (parts by mass) presented in Tables 1 and 2 so that the solid concentration was 65 mass %. The mixture was stirred for 60 minutes. To the mixture, 1,3-bis(butylperoxyisopropyl)benzene (Perbutyl P manufactured by NOF CORPORATION) that was the initiator was then added in the blending proportion presented in Table 1 to obtain a varnish-like resin composition (resin varnish) of each of Examples and Comparative Examples. This resin varnish was used to fabricate the following substrate for evaluation.

(Substrate for Heat Resistance Evaluation)

The resin varnishes obtained in Examples and Comparative Examples were each impregnated into a glass base material (#2116 type, "L glass" (manufactured by Asahi Kasei Corporation), relative permittivity: 4.6), and then heating and drying were performed at 130° C. for about 3 to 8 minutes to obtain prepregs. At that time, the content (resin content) of resin components such as polyphenylene ether and the crosslinking agent was adjusted to be about 50 mass %.

Thereafter, each of the obtained prepregs was stacked by six sheets, and a copper foil presented in Table 1 was stacked on both surfaces of each stacked body, and the resultant stacked body was hot-pressed under the conditions of a temperature of 200° C., a time of 2 hours, and a pressure of 3 MPa to obtain a copper clad laminate for evaluation having a thickness of 750 μm.

[Oven Heat Resistance Test]

When test pieces fabricated using the obtained copper foil-clad laminate plates in conformity with JIS C 6481 were treated for 1 hour in a thermostatic chamber with air circulating apparatus set at 250° C., 260° C., 280° C., and 300° C., a case where abnormality was not observed in all five test pieces was determined as "PASS", and a case where "swelling" or "peeling off" occurred in one or more of five test pieces was determined as "NG". In the present test, a sample that is evaluated as "PASS" at 280° C. is acceptable.

[Glass Transition Temperature (Tg)]

The Tg of the sample obtained by etching the whole outer layer copper foil of the copper clad laminate was measured using a viscoelastic spectrometer "DMS6100" manufactured by Seiko Instruments Inc. At this time, a dynamic viscoelasticity measurement (DMA) was performed in a three-pint bending mode at a frequency set to 10 Hz, and the temperature at which tan δ was the maximum when the temperature was raised from room temperature to 320° C. under the condition of a rate of temperature rise of 5° C./min was defined as Tg.

(Substrate for Transmission Property Evaluation)

The resin varnishes obtained in Examples and Comparative Examples were each impregnated into a glass base material (#1078 type, "L glass" (manufactured by Asahi Kasei Corporation), relative permittivity: 4.6), and then heating and drying were performed at 130° C. for about 3 to 8 minutes to obtain prepregs. At that time, the content (resin content) of resin components such as polyphenylene ether and the crosslinking agent was adjusted to be about 60 mass %.

Thereafter, each of the obtained prepregs was stacked by two sheets, and a copper foil presented in Table 1 was stacked on both surfaces of each stacked body, and the resultant stacked body was hot-pressed under the conditions of a temperature of 200° C., a time of 2 hours, and a pressure of 3 MPa to obtain a copper clad laminate for evaluation having a thickness of 150 μm.

[Transmission Loss Evaluation Test]

Next, one surface of the obtained double-sided plate was processed to have a line width of 100 to 200 μm, and then two prepregs were secondarily laminated so as to sandwich the processed surface to fabricate a three-layered plate. The line width was adjusted after finishing so that the characteristic impedance of the circuit was 50Ω.

The transmission properties of the obtained laminate plate were evaluated by measuring the passage loss using a network analyzer (N5230A manufactured by Keysight Technologies, Inc.). The evaluation frequency was 20 GHz.

The test results are presented in Tables 3 and 4.

TABLE 3

| Resin composition | Molecular weight Mw | Example 1 | Example 2 | Example 3 | Example 4 | Example 5 | Example 6 | Example 7 | Example 8 | Example 9 | Example 10 | Example 11 | Example 12 |
|---|---|---|---|---|---|---|---|---|---|---|---|---|---|
| Modified PPE1 | 2300 | | | | | | | | | 10 | 20 | | |
| Modified PPE2 | 3300 | | | | | | | | | | | | |
| SA9000 Terminal methacryl PPE | 2000 | | | | | | | | | | | 10 | 20 |
| SA90 Unmodified PPE | 1700 | | | | | | | | | | | | |
| Polymer 1 | 26300 | | | | | | | 70 | | | | | |
| Polymer 2 | 31000 | 70 | 70 | 70 | 70 | 50 | 85 | | | 63 | 56 | 63 | 56 |
| Polymer 3 | 39500 | | | | | | | | 70 | | | | |
| TAIC | | | | 30 | | | | | | | | | |
| Acenaphthylene | | 30 | 30 | | | 50 | 15 | 30 | 30 | 27 | 24 | 27 | 24 |
| Dibromostyrene | | | | | 30 | | | | | | | | |
| Perbutyl P | | 1 | 1 | 1 | 1 | 1 | 1 | 1 | 1 | 1 | 1 | 1 | 1 |
| Copper foil | | | | | | | | | | | | | |
| Surface treated copper foil 3 Ni: 0 mg/m$^2$ | | | | | | | | | | | | | |
| Surface treated copper foil 2 Ni: 32 mg/m$^2$ | | ● | | | | | | | | | | | |
| Surface treated copper foil 1 Ni: 56 mg/m$^2$ | | | ● | ● | ● | ● | ● | ● | ● | ● | ● | ● | ● |
| Surface treated copper foil 4 Ni: 82 mg/m$^2$ | | | | | | | | | | | | | |
| Surface treated copper foil 5 Ni: 106 mg/m$^2$ | | | | | | | | | | | | | |
| Surface treated copper foil 6 Ni: 32 mg/m$^2$, roughened particle size: 700 to 1400 nm | | | | | | | | | | | | | |
| Surface treated copper foil 7 No rust prevention layer, Ni: 42 mg/m$^2$ | | | | | | | | | | | | | |
| Evaluation item | | | | | | | | | | | | | |
| Oven heat resistance 250° C. | | | | | | | | | | | | | |
| Oven heat resistance 260° C. | | | | | | | | | | | | | |
| Oven heat resistance 280° C. | | Pass | Pass | Pass | Pass | Pass | Pass | Pass | Pass | Pass | Pass | Pass | Pass |
| Oven heat resistance 300° C. | | NG | Pass | Pass | Pass | Pass | Pass | Pass | Pass | Pass | Pass | Pass | Pass |
| Tg DMA three-point bending | | 220 | 220 | 180 | 210 | 230 | 200 | 205 | 232 | 235 | 245 | 230 | 240 |
| Transmission loss dB/m | | −28.5 | −29 | −29 | −29.5 | −29.2 | −28 | −29 | −29 | −29.2 | −29.5 | −29.3 | −29.5 |

TABLE 4

| Resin composition | Molecular weight Mw | Comparative Example 1 | Comparative Example 2 | Comparative Example 3 | Comparative Example 4 | Comparative Example 5 | Comparative Example 6 | Comparative Example 7 | Comparative Example 8 |
|---|---|---|---|---|---|---|---|---|---|
| Modified PPE1 | 2300 | 70 | | | | | | | |
| Modified PPE2 | 3300 | | 70 | | | | | | |

TABLE 4-continued

| Resin composition | Molecular weight Mw | Comparative Example 1 | Comparative Example 2 | Comparative Example 3 | Comparative Example 4 | Comparative Example 5 | Comparative Example 6 | Comparative Example 7 | Comparative Example 8 |
|---|---|---|---|---|---|---|---|---|---|
| SA9000 Terminal methacryl PPE | 2000 | | | 70 | | | | | |
| SA90 Unmodified PPE | 1700 | | | | | | | | |
| Polymer 1 | 26300 | | | | | | | | |
| Polymer 2 | 31000 | | | | 70 | 70 | 70 | 70 | 70 |
| Polymer 3 | 39500 | | | | | | | | |
| TAIC | | | | | | | | | |
| Acenaphthylene | | 30 | 30 | 30 | 30 | 30 | 30 | 30 | 30 |
| Dibromostyrene | | | | | | | | | |
| Perbutyl P | | 1 | 1 | 1 | 1 | 1 | 1 | 1 | 1 |
| Copper foil | | | | | | | | | |
| Surface treated copper foil 3 Ni: 0 mg/m$^2$ | | | | | ● | | | | |
| Surface treated copper foil 2 Ni: 32 mg/m$^2$ | | | | | | | | | |
| Surface treated copper foil 1 Ni: 56 mg/m$^2$ | | ● | ● | ● | | | | | |
| Surface treated copper foil 4 Ni: 82 mg/m$^2$ | | | | | | ● | | | |
| Surface treated copper foil 5 Ni: 106 mg/m$^2$ | | | | | | | ● | | |
| Surface treated copper foil 6 Ni: 32 mg/m$^2$, roughened particle size: 700 to 1400 nm | | | | | | | | ● | |
| Surface treated copper foil 7 No rust prevention layer, Ni: 42 mg/m$^2$ | | | | | | | | | ● |
| Evaluation item | | | | | | | | | |
| Oven heat resistance 250° C. | | | | | NG | | | | |
| Oven heat resistance 260° C. | | | | | | | | | Pass |
| Oven heat resistance 280° C. | | Pass | Pass | Pass | | Pass | Pass | Pass | NG |
| Oven heat resistance 300° C. | | Pass | Pass | Pass | | Pass | Pass | NG | |
| Tg DMA three-point bending | | 220 | 200 | 250 | 220 | 220 | 220 | 220 | 220 |
| Transmission loss dB/m | | −31 | −30.5 | −31.5 | −28 | −30.5 | −31.5 | −33 | −28 |

As is clear from the results in Table 3, it was confirmed that the laminate plates fabricated using the surface treated copper foil and resin composition of the present invention exhibit excellent heat resistance and also significantly excellent transmission properties.

It was also found that a higher Tg is obtained in the case of using a resin composition in which the polymer and modified polyphenylene ether compound of the present invention are used concurrently.

In contrast, in Comparative Examples 1 to 3 in which the resin composition of the present invention was not used, the transmission loss was inferior to that in Examples. In Comparative Example 4 in which the amount of nickel attached in the heat resistance treatment layer of the surface treated copper foil was 0, it was not possible to obtain heat resistance. On the other hand, in Comparative Example 5 and Comparative Example 6 in which the amount of nickel attached in the heat resistance treatment layer was excessive, the transmission properties were insufficient.

In Comparative Example 7 in which the copper particle size in the finely roughened particle treatment layer was large, the transmission properties were inferior and the heat resistance was also not sufficient. Also in Comparative Example 8 in which the rust prevention treatment layer was not formed, it was not possible to obtain sufficient heat resistance.

This application is based on Japanese Patent Application No. 2019-092354 filed on May 15, 2019, the contents of which are included in the present application.

In order to express the present invention, the present invention has been described above appropriately and sufficiently through the embodiments with reference to specific examples, drawings and the like. However, it should be recognized by those skilled in the art that changes and/or improvements of the above-described embodiments can be readily made. Accordingly, changes or improvements made by those skilled in the art shall be construed as being included in the scope of the claims unless otherwise the changes or improvements are at the level which departs from the scope of the appended claims.

INDUSTRIAL APPLICABILITY

The present invention has a wide range of industrial applicability in technical fields of electronic materials, electronic devices and the like.

The invention claimed is:

1. A copper clad laminate comprising:
an insulating layer containing a cured product of a resin composition; and
a surface treated copper foil on one surface or both surfaces of the insulating layer, wherein
the resin composition contains a polymer having a structural unit represented by the following Formula (1) in a molecule:

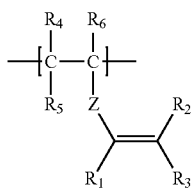

(1)

wherein in Formula (1), Z represents an arylene group, $R_1$ to $R_3$ each independently represent a hydrogen atom or an alkyl group, and $R_4$ to $R_6$ each independently represent a hydrogen atom or an alkyl group having 1 to 6 carbon atoms, the resin composition further contains a modified polyphenylene ether compound having a terminal modified with the following Formula (5) or (6):

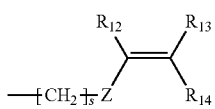

(5)

wherein in Formula (5), s represents an integer 0 to 10, Z represents an arylene group, and $R_{12}$ to $R_{14}$ each independently represent a hydrogen atom or an alkyl group,

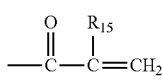

(6)

wherein in Formula (6), $R_{15}$ represents a hydrogen atom or an alkyl group; and
the surface treated copper foil includes a finely roughened particle treatment layer of copper on at least one surface side of a copper foil, wherein
the finely roughened particle treatment layer is formed of fine copper particles having a particle size of 40 to 200 nm,
a heat resistance treatment layer containing nickel is provided on the finely roughened particle treatment layer,
a rust prevention treatment layer containing at least chromium is provided on the heat resistance treatment layer,
a silane coupling agent treatment layer is provided on the rust prevention treatment layer, and
an amount of nickel attached in the heat resistance treatment layer is 30 to 60 mg/m$^2$.

2. The copper clad laminate according to claim 1, wherein the structural unit represented by Formula (1) includes a structural unit represented by the following Formula (2):

(2)

wherein in Formula (2), $R_4$ to $R_6$ each independently represent a hydrogen atom or an alkyl group having 1 to 6 carbon atoms and $R_7$ represents an arylene group having 6 to 12 carbon atoms.

3. The copper clad laminate according to claim 2, wherein the structural unit represented by Formula (2) includes a structural unit represented by the following Formula (3):

(3)

wherein in Formula (3), $R_4$ to $R_6$ each independently represent a hydrogen atom or an alkyl group having 1 to 6 carbon atoms.

4. The copper clad laminate according to claim 1, wherein the polymer includes a polymer having a structural unit represented by the following Formula (4) in a molecule:

(4)

wherein in Formula (4), $R_8$ to $R_{10}$ each independently represent a hydrogen atom or an alkyl group having 1 to 6 carbon atoms and $R_{11}$ represents an aryl group.

5. The copper clad laminate according to claim 4, wherein the aryl group in the structural unit represented by Formula (4) includes an aryl group having an alkyl group having 1 to 6 carbon atoms.

6. The copper clad laminate according to claim 1, wherein a weight average molecular weight of the polymer is 1500 to 40,000.

7. The copper clad laminate according to claim 1, wherein an equivalent of a vinyl group included in the structural unit represented by Formula (1), where $R_1$ to $R_3$ are a hydrogen atom, of the polymer is 250 to 1200.

8. The copper clad laminate according to claim 1, wherein the heat resistance treatment layer in the surface treated copper foil is formed of nickel or nickel and phosphorus.

9. A circuit board comprising the copper clad laminate according to claim 1,
wherein a conductor pattern as a circuit is provided on a surface of the circuit board.

10. A copper foil with resin comprising:
a resin layer containing a resin composition or a semi-cured product of the resin composition; and
a surface treated copper foil on one surface of the resin layer, wherein
the resin composition contains a polymer having a structural unit represented by the following Formula (1) in a molecule:

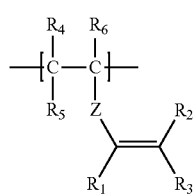

(1)

wherein in Formula (1), Z represents an arylene group, $R_1$ to $R_3$ each independently represent a hydrogen atom or an alkyl group, and $R_4$ to $R_6$ each independently represent a hydrogen atom or an alkyl group having 1 to 6 carbon atoms,
the resin composition further contains a modified polyphenylene ether compound having a terminal modified with the following Formula (5) or (6):

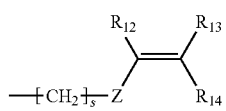

(5)

wherein in Formula (5), s represents an integer 0 to 10, Z represents an arylene group, and $R_{12}$ to $R_{14}$ each independently represent a hydrogen atom or an alkyl group,

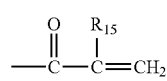

(6)

wherein in Formula (6), $R_{15}$ represents a hydrogen atom or an alkyl group; and
the surface treated copper foil includes a finely roughened particle treatment layer of copper on at least one surface side of a copper foil, wherein
the finely roughened particle treatment layer is formed of fine copper particles having a particle size of 40 to 200 nm,
a heat resistance treatment layer containing nickel is provided on the finely roughened particle treatment layer,
a rust prevention treatment layer containing at least chromium is provided on the heat resistance treatment layer,
a silane coupling agent layer is provided on the rust prevention treatment layer, and
an amount of nickel attached in the heat resistance treatment layer is 30 to 60 mg/m².

11. A circuit board comprising the copper foil with resin according to claim 10,
wherein a conductor pattern as a circuit is provided on a surface of the circuit board.

12. A resin composition for formation of an insulating layer in a copper clad laminate including the insulating layer containing a cured product of the resin composition and a surface treated copper foil on one surface or both surfaces of the insulating layer,
the resin composition comprising a polymer having a structural unit represented by the following Formula (1) in a molecule:

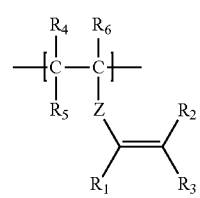

(1)

wherein in Formula (1), Z represents an arylene group, $R_1$ to $R_3$ each independently represent a hydrogen atom or an alkyl group, and $R_4$ to $R_6$ each independently represent a hydrogen atom or an alkyl group having 1 to 6 carbon atoms,
the resin composition further comprising a modified polyphenylene ether compound having a terminal modified with the following Formula (5) or (6);

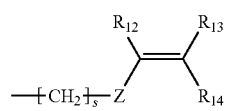

(5)

wherein in Formula (5), s represents an integer 0 to 10, Z represents an arylene group, and $R_{12}$ to $R_{14}$ each independently represent a hydrogen atom or an alkyl group,

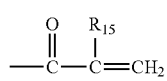

(6)

wherein in Formula (6), $R_{15}$ represents a hydrogen atom or an alkyl group; and
the surface treated copper foil includes a finely roughened particle treatment layer of copper on at least one surface side of a copper foil, wherein
the finely roughened particle treatment layer is formed of fine copper particles having a particle size of 40 to 200 nm,
a heat resistance treatment layer containing nickel is provided on the finely roughened particle treatment layer, a rust prevention treatment layer containing at least chromium is provided on the heat resistance treatment layer,
a silane coupling agent layer is provided on the rust prevention treatment layer, and
an amount of nickel attached in the heat resistance treatment layer is 30 to 60 mg/m².

* * * * *